(12) United States Patent
Ooga et al.

(10) Patent No.: US 10,889,729 B2
(45) Date of Patent: Jan. 12, 2021

(54) CURABLE COMPOSITION, CURED OBJECT, OVERCOAT FILM, COATED FLEXIBLE WIRING BOARD, AND PROCESS FOR PRODUCING SAME

(71) Applicant: NIPPON POLYTECH CORP., Hachioji (JP)

(72) Inventors: Kazuhiko Ooga, Tokyo (JP); Naoki Murata, Tokyo (JP); Kai Suzuki, Tokyo (JP)

(73) Assignee: NIPPON POLYTECH CORP., Tokyo (JP)

( * ) Notice: Subject to any disclaimer, the term of this patent is extended or adjusted under 35 U.S.C. 154(b) by 157 days.

(21) Appl. No.: 16/061,042

(22) PCT Filed: Nov. 17, 2016

(86) PCT No.: PCT/JP2016/084164
§ 371 (c)(1),
(2) Date: Jun. 11, 2018

(87) PCT Pub. No.: WO2017/110326
PCT Pub. Date: Jun. 29, 2017

(65) Prior Publication Data
US 2018/0355195 A1 Dec. 13, 2018

(30) Foreign Application Priority Data

Dec. 25, 2015 (JP) ................. 2015-254896

(51) Int. Cl.
| | |
|---|---|
| *C09D 11/102* | (2014.01) |
| *C08G 18/42* | (2006.01) |
| *C08G 18/34* | (2006.01) |
| *C08G 18/32* | (2006.01) |
| *C08G 18/66* | (2006.01) |
| *C08G 18/75* | (2006.01) |
| *C08G 18/16* | (2006.01) |
| *C09D 11/037* | (2014.01) |
| *C08K 3/36* | (2006.01) |
| *C08K 3/26* | (2006.01) |
| *H05K 1/02* | (2006.01) |
| *H05K 1/03* | (2006.01) |
| *H05K 3/46* | (2006.01) |
| *C08K 3/34* | (2006.01) |
| *C09D 175/04* | (2006.01) |
| *C08L 63/00* | (2006.01) |
| *C09D 7/40* | (2018.01) |
| *C08L 75/06* | (2006.01) |

(52) U.S. Cl.
CPC .......... *C09D 11/102* (2013.01); *C08G 18/168* (2013.01); *C08G 18/3215* (2013.01); *C08G 18/348* (2013.01); *C08G 18/42* (2013.01); *C08G 18/4211* (2013.01); *C08G 18/6659* (2013.01); *C08G 18/758* (2013.01); *C08K 3/26* (2013.01); *C08K 3/34* (2013.01); *C08K 3/36* (2013.01); *C08L 63/00* (2013.01); *C08L 75/06* (2013.01); *C09D 7/40* (2018.01); *C09D 11/037* (2013.01); *C09D 175/04* (2013.01); *H05K 1/028* (2013.01); *H05K 1/0271* (2013.01); *H05K 1/0353* (2013.01); *H05K 3/4644* (2013.01); *C08K 2003/267* (2013.01); *H05K 2203/1105* (2013.01)

(58) Field of Classification Search
CPC .................................................. C08G 18/3215
See application file for complete search history.

(56) References Cited

U.S. PATENT DOCUMENTS

| | | | |
|---|---|---|---|
| 6,162,889 A | 12/2000 | Orikabe et al. | |
| 2003/0088049 A1* | 5/2003 | DeGuia .............. | C08G 18/4854 528/79 |
| 2009/0082518 A1 | 3/2009 | Uchida et al. | |
| 2009/0099283 A1 | 4/2009 | Ishihara et al. | |
| 2009/0171015 A1* | 7/2009 | Uchida .............. | C08G 18/4854 524/590 |
| 2011/0253426 A1 | 10/2011 | Ooga et al. | |
| 2012/0305295 A1 | 12/2012 | Kimura et al. | |

FOREIGN PATENT DOCUMENTS

| | | |
|---|---|---|
| CN | 102264838 A | 11/2011 |
| JP | 11-61038 A | 3/1999 |
| JP | 2004-137370 A | 5/2004 |
| JP | 2004-182792 A | 7/2004 |
| JP | 2006-307183 A | 11/2006 |
| JP | 2006-348278 A | 12/2006 |

(Continued)

OTHER PUBLICATIONS

International Search Report of PCT/JP2016/084164 dated Jan. 31, 2017.

*Primary Examiner* — Ian A Rummel

(74) *Attorney, Agent, or Firm* — Birch, Stewart, Kolasch & Birch, LLP

(57) ABSTRACT

A curable composition for forming an overcoat film for flexible wiring boards, the curable composition being effective in improving adhesion to substrates, low warpage, flexibility, the property of inhibiting wire breakage, and long-term reliability. The curable composition according to the present invention comprises a polyurethane (component a) having carboxyl groups and an aromatic-ring concentration of 0.1-6.5 mmol/g and containing an organic residue derived from a polyisocyanate, a solvent (component b), and a compound (component c) having two or more epoxy groups in the molecule.

14 Claims, No Drawings

(56) References Cited

FOREIGN PATENT DOCUMENTS

| | | | |
|---|---|---|---|
| JP | 2007-154134 | A | 6/2007 |
| JP | 2007-270137 | A | 10/2007 |
| JP | 2008-045032 | A | 2/2008 |
| JP | 2008-201877 | A | 9/2008 |
| JP | 2009-280686 | A | 12/2009 |
| JP | 2010-111876 | A | 5/2010 |
| JP | 2012-206343 | A | 10/2012 |
| JP | 2014-177621 | A | 9/2014 |
| JP | 2014177621 | A * | 9/2014 |
| JP | 2014-189746 | A | 10/2014 |
| KR | 10-0971852 | B1 | 7/2010 |
| TW | 200745260 | A | 12/2007 |
| WO | 2006/104243 | A1 | 10/2006 |
| WO | 2007/066816 | A1 | 6/2007 |
| WO | 2007/105713 | A1 | 9/2007 |
| WO | 2007/105781 | A1 | 9/2007 |
| WO | 2011/096295 | A1 | 8/2011 |

* cited by examiner

CURABLE COMPOSITION, CURED OBJECT, OVERCOAT FILM, COATED FLEXIBLE WIRING BOARD, AND PROCESS FOR PRODUCING SAME

CROSS REFERENCE TO RELATED APPLICATIONS

This application is a National Stage of International Application No. PCT/2016/084164 filed Nov. 17, 2016, claiming priority based on Japanese Patent Application No. 2015-254896 filed Dec. 25, 2015.

FIELD

The present invention relates to: a curable composition which hardly bleeds when screen-printed; a cured product of the curable composition; an overcoat film obtained by curing the curable composition; a flexible wiring board covered with the overcoat film; and a method of producing the flexible wiring board.

BACKGROUND

Conventionally, in surface protective films of flexible wiring circuits, there are films of a type that is obtained by punching out a polyimide film called "coverlay film" using a mold conforming to a pattern and subsequently pasting the film with an adhesive, and films of a type that is obtained by applying a flexible UV-curable or heat-curable overcoat agent by a screen printing method. Particularly, those films of the latter type are useful in terms of workability. As such curable-type overcoat agents, resin compositions based on an epoxy resin, an acrylic resin, or a composite of these resins are known. These resin compositions often contain, as a main component, a resin modified by introduction or the like of particularly, for example, a butadiene structure, a siloxane structure, a polycarbonate diol structure or a long-chain aliphatic structure, and such modification allows to improve the flexibility and suppress the occurrence of warping due to cure shrinkage while minimizing a reduction in the heat resistance, chemical resistance and electrical insulation that are inherent to surface protective films.

However, in recent years, in association with reduction in size and weight of electronic equipment, flexible substrates have also been reduced in weight and thickness, consequently making the effects of flexibility and cure shrinkage of an over-coated resin composition more prominent and apparent. Accordingly, the existing curable-type covercoat agents no longer satisfy required performance in terms of flexibility and warping caused by cure shrinkage.

For example, Patent Literature 1 discloses a resin composition containing a polybutadiene block isocyanate and a polyol, and a cured product thereof is excellent in terms of flexibility and shrinkage rate; however, it does not have sufficient heat resistance.

Patent Literature 2 discloses a composition containing a polyamide-imide resin and an amine-type epoxy resin, which polyamide-imide resin is produced by allowing a polyurethane having a diisocyanate at both terminals that is obtained by reaction between a polycarbonate diol and a diisocyanate compound to react with trimellitic acid; however, there is a drawback in that a cured product obtained from a polyamide-imide resin and an amine-type epoxy resin does not have sufficient long-term reliability in electrical properties.

Patent Literature 3 discloses a composition that includes a carboxyl group-containing polyurethane polyimide and an epoxidized polybutadiene; however, this composition has a drawback in that, when the composition is dried for solvent removal, the carboxyl group-containing polyurethane polyimide and the epoxidized polybutadiene readily generate a phase-separated structure and a uniform coating film is thus unlikely to be formed.

Further, Patent Literature 4 discloses a polyamide-imide resin containing an organosiloxane structure; however, not only a cured product of this resin does not exhibit good adhesion with substrates but also it requires the use of a special solvent such as N-methyl-2-pyrrolidone and, particularly, such a solvent may dissolve an emulsifier during screen printing, causing problems in some cases.

Still further, Patent Literature 5 discloses a composition which contains: a carboxyl group-containing polyurethane having a polyol unit selected from the group consisting of polybutadiene polyols, polyisoprene polyols, hydrogenated polybutadiene polyols and hydrogenated polyisoprene polyols; and an epoxy compound. For instance, turning out attention to circuit pattern formation methods employed in the COF (Chip-on-Film) package systems, a subtractive method is currently employed for producing those wirings that are widely and commonly used in the COF package systems. As an insulating coating film for a wiring produced by a subtractive method, a cured product obtained from the composition disclosed in Patent Literature 5 exhibits sufficient insulation performance.

Moreover, Patent Literature 6 discloses a heat-curable composition exhibiting good adhesion to tin-plated copper substrates. With regard to cured products obtained by curing this composition, the cured product (flexible circuit board overcoat film) disclosed in Patent Literature 6 exhibits sufficient insulation performance as an insulating coating film for a wiring produced by a subtractive method.

Furthermore, Patent Literature 7 discloses a heat-curable composition which inhibits breakage of wiring on a flexible wiring board.

However, as semi-additive methods are more developed, the wiring pitches of flexible wiring boards are expected to be further reduced (e.g., a pitch of not more than 20 μm).

In association with such further pitch reduction, it is desired to develop a resin which has superior electrical insulation reliability and exhibits low warpage and flexibility that are favorable for flexible wiring boards.

In addition, since there is a problem that a reduction in the wiring pitch of a flexible wiring board sometimes results in wiring breakage when a pre-assembly module on which the flexible wiring board is mounted is moved, it is demanded to develop an overcoat film capable of inhibiting such wiring breakage.

CITATION LIST

Patent Literature

[Patent Literature 1] Japanese Unexamined Patent Publication (Kokai) No. H11-61038
[Patent Literature 2] Japanese Unexamined Patent Publication (Kokai) No. 2004-137370
[Patent Literature 3] Japanese Unexamined Patent Publication (Kokai) No. 2006-307183
[Patent Literature 4] Japanese Unexamined Patent Publication (Kokai) No, 2004-182792
[Patent Literature 5] Japanese Unexamined Patent Publication (Kokai) No, 2006-348278

[Patent Literature 6] International Publication No. WO 2007/105713 A1

[Patent Literature 7] International Publication No. WO 2011/096295 A1

SUMMARY

Technical Problem

An object of the present invention is to provide a curable composition which comprises a carboxyl group-containing polyurethane having an aromatic ring concentration of 0.1 to 6.5 mmol/g and is capable of yielding a cured product that exhibits excellent adhesion with a substrate, low warpage, flexibility, inhibition of wiring breakage and long-term reliability; a flexible wiring board overcoat film obtained by curing the composition; and a method of producing a flexible wiring board by use of the overcoat film.

Solution to Problem

The present inventors intensively studied to solve the above-described problems and consequently discovered that, when a curable composition comprising a carboxyl group-containing polyurethane having an aromatic ring concentration of 0.1 to 6.5 mmol/g is screen-printed on a flexible wiring board and the resulting printed film is cured, the curing of the printed film (curable composition) causes little warpage of the flexible wiring board, and that an overcoat film obtained by curing this curable composition exhibits excellent inhibition of wiring breakage, flexibility and long-term electrical insulation properties, thereby completing the present invention.

In other words, the present invention (I) is a curable composition comprising (component (a)) a carboxyl group-containing polyurethane which has an aromatic ring concentration of 0.1 to 6.5 mmol/g and contains an organic residue derived from a polyisocyanate;

(component (b)) a solvent; and (component (c)) a compound having two or more epoxy groups in one molecule.

The present invention (II) is a cured product of the curable composition of the present invention (I).

The present invention (III) is a flexible wiring board overcoat film comprising the cured product of the present invention (II).

The present invention (IV) is a flexible wiring board comprising a flexible substrate and a wiring formed on the flexible substrate, wherein a part or all of a surface on which the wiring is formed is covered with the overcoat film of the present invention (III).

The present invention (V) is a method of producing a flexible wiring board covered with an overcoat film, comprising (step A) the step of printing the curable composition of the present invention (I) on a part or all of a surface of a flexible wiring board comprising a flexible substrate and a wiring formed on the flexible substrate, on which surface the wiring is formed, and thereby forming a printed film on the wiring;

(step B) the step of placing the printed film obtained in step A in an atmosphere of 40° C. to 100° C. to evaporate a part or all of the solvent contained in the printed film; and (step C) the step of heating and curing the printed film obtained in step A or the printed film obtained in step B at 100° C. to 170° C. to forming an overcoat film.

The present invention includes the following embodiments.

[1] A curable composition comprising (component (a)) a carboxyl group-containing polyurethane which has an aromatic ring concentration of 0.1 to 6.5 mmol/g and contains an organic residue derived from a polyisocyanate;

(component (b)) a solvent; and (component (c)) a compound having two or more epoxy groups in one molecule.

[2] The curable composition according to [1], wherein component (a) is a polyurethane having a structural unit represented by formula (1):

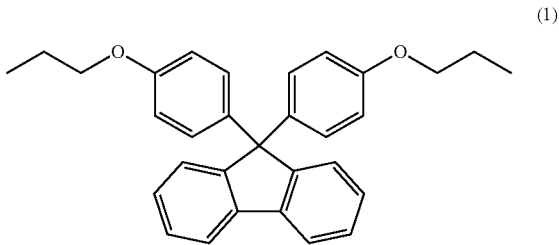

[3] The curable composition according to [1] or [2], wherein component (a) is a polyurethane having a structural unit represented by formula (2):

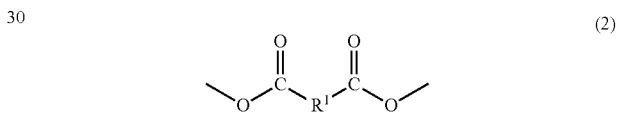

wherein $R^1$ each independently represents a phenylene group or a phenylene group having a substituent.

[4] The curable composition according to any one of [1] to [3], wherein component (a) is a polyurethane having a structural unit represented by formula (3):

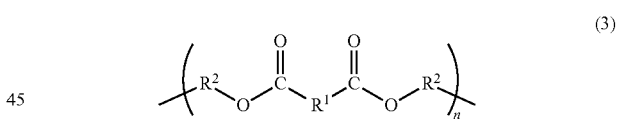

wherein n $R^1$ s each independently represent a phenylene group or a phenylene group having a substituent; (n+1) $R^2$s each independently represent an alkylene group having 3 to 9 carbon atoms; and n represents a natural number of not more than 50.

[5] The curable composition according to any one of [1] to [4], wherein component (a) contains an organic residue derived from a cyclic aliphatic polyisocyanate in an amount of not less than 70% by mole based on the total amount of the organic residue derived from the polyisocyanate.

[6] The curable composition according to any one of [1] to [5], wherein the amount of component (a) is 40 to 99% by mass based on the total amount of components (a) and (c).

[7] The curable composition according to any one of [1] to [6], wherein the amount of component (b) is 25 to 75% by mass based on the total amount of components (a), (b) and (c).

[8] The curable composition according to any one of [1] to [7], wherein component (a) has a number-average molecular weight of 3,000 to 50,000 and an acid value of 10 to 70 mg-KOH/g.

[9] The curable composition according to any one of [1] to [8], further comprising (component (d)) at least one particulate selected from the group consisting of an inorganic particulate and organic particulate.

[10] The curable composition according to [9], wherein component (d) comprises a silica particulate.

[11] The curable composition according to [9] or [10], wherein component (d) comprises a hydrotalcite particulate.

[12] A cured product of the curable composition according to any one of [1] to [11].

[13] A flexible wiring board overcoat film comprising the cured product according to [12].

[14] A flexible wiring board comprising a flexible substrate and a wiring formed on the flexible substrate, wherein a part or all of a surface on which the wiring is formed is covered with the overcoat film according to [13],

[15] A method of producing a flexible wiring board covered with an overcoat film, comprising (step A) the step of printing the curable composition according to any one of [1] to [11] on a part or all of a surface of a flexible wiring board comprising a flexible substrate and a wiring formed on the flexible substrate, on which surface the wiring is formed, and thereby forming a printed film on the wiring;

(step B) the step of placing the printed film obtained in step A in an atmosphere of 40° C. to 100° C. to evaporate a part or all of the solvent contained in the printed film; and (step C) the step of heating and curing the printed film obtained in step A or the printed film obtained in step B at 100° C. to 170° C. to form an overcoat film.

Advantageous Effects of Invention

The curable composition of the present invention has good ease of handling, and a cured product obtained by curing the curable composition not only has good flexibility and moisture resistance as well as high-level long-term electrical insulation reliability, but also exhibits inhibition of wiring breakage and low warpage as well as good adhesion with substrates. Therefore, when the curable composition of the present invention is coated on a flexible wiring board or a flexible substrate such as a polyimide film and a cured product (protective film) is subsequently produced by curing reaction of the composition, the flexible wiring board or flexible substrate that is equipped with the thus obtained protective film exhibits little warpage, and this makes it easy to perform alignment in the subsequent IC chip mounting step.

Furthermore, the cured product of the present invention has flexibility and, therefore, enables to provide a flexible wiring board equipped with an electrical insulation protective film that is unlikely to generate cracks (e.g., a flexible printed wiring board such as COF).

DESCRIPTION OF EMBODIMENTS

The present invention is described below in detail.

First, the curable composition of the present invention (I) will be described.

[Present Invention (I)]

The present invention (I) is a curable composition comprising following components (a) to (c):

(component (a)) a carboxyl group-containing polyurethane which has an aromatic ring concentration of 0.1 to 6.5 mmol/g and contains an organic residue derived from a polyisocyanate;

(component (b)) a solvent; and (component (c)) a compound having two or more epoxy groups in one molecule.

These components are each described below.

<Component (a)>

Component (a), which is indispensable component of the curable composition of the present invention (I), is a carboxyl group-containing polyurethane which has an aromatic ring concentration of 0.1 to 6.5 mmol/g and contains an organic residue derived from a polyisocyanate. The term "polyurethane" used herein is defined as a substance in which plural urethane bonds exist.

Examples of an aromatic ring structure of component (a) include a benzene ring structure, a biphenyl structure, a naphthalene structure, and a fluorene structure.

The aromatic ring concentration of component (a) is 0.1 to 6.5 mmol based on 1 g of component (a) (i.e., 0.1 to 6.5 mmol/g), preferably 0.1 to 5.0 mmol based on 1 g of component (a) (i.e., 0.1 to 5.0 mmol/g), more preferably 0.5 to 4.5 mmol based on 1 g of component (a) (i.e., 0.5 to 4.5 mmol/g), particularly preferably 1.0 to 4.0 mmol based on I g of component (a) 1.0 to 4.0 mmol/g). When the aromatic ring concentration of component (a) is 0.1 to 6.5 mmol based on 1 g of component (a) (i.e., 0.1 to 6.5 mmol/g), a good balance can be easily attained between the solvent resistance of the below-described overcoat film of the present invention and the warpage of the below-described flexible wiring board of the present invention.

The aromatic ring concentration can be calculated from the material addition ratio; however, it can also be analyzed by determining the structure based on $^1$H-NMR, $^{13}$C-NMR and IR spectra and then comparing the number of protons derived from an aromatic ring and the number of protons derived from a unit in the $^1$H-NMR spectrum (comparison based on a $^1$H-NMR integral curve)

As for the number of aromatic rings in the present specification, an aromatic ring is counted as 1, and a condensed ring is also counted as 1. For example, a benzene ring of following formula (51) is counted as one aromatic ring. A biphenyl structure of following formula (52) and a 9H-fluorene structure of following formula (53) each have two benzene rings and are thus counted as two aromatic rings. A naphthalene structure of following formula (54) is also counted as two aromatic rings. In the same manner, an anthracene structure (formula (55)) and a phenanthrene structure (formula (56)) are each counted as three aromatic rings. A triphenylene structure (formula (57)) and a binaphthyl structure (formula (58)) are each counted as four aromatic rings.

It is noted here that the number of circles (o) in following formulae (51') to (58') each represent the number of aromatic rings in respective formulae (51) to (58).

(51)

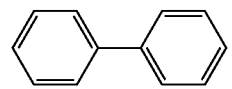

(52)

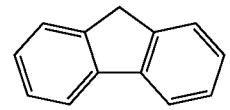

(53)

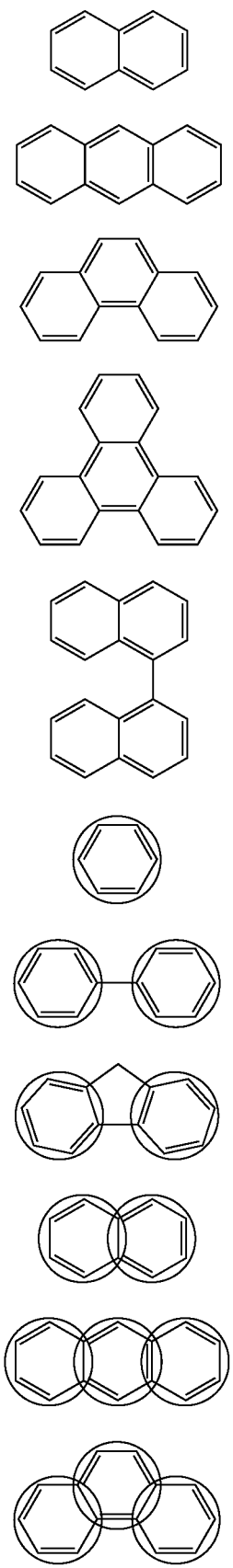

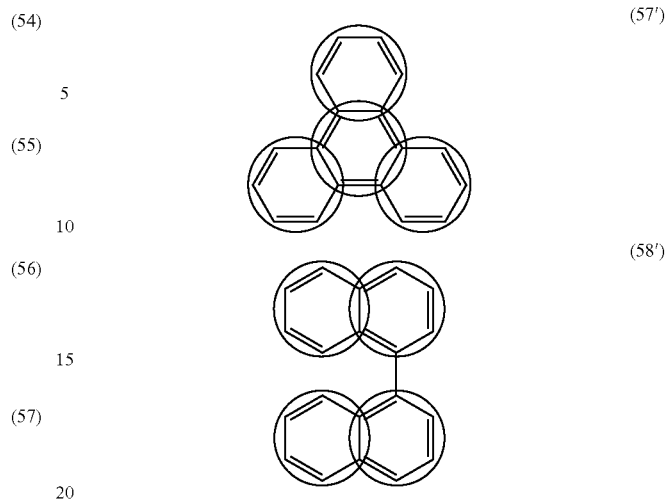

A method of producing component (a) is not particularly limited, and component (a) can be synthesized by, for example, allowing a polyisocyanate compound, a carboxyl group-containing diol, a polyol other than the carboxyl group-containing diol and, as required, a monohydroxyl compound and a monoisocyanate compound to react with each other using a solvent in the presence or absence of a known urethanization catalyst such as dibutyl tin dilaurate. This reaction is preferably performed in the absence of a catalyst since the long-term insulation reliability of the below-described overcoat film of the present invention is thereby improved.

The structure of component (a) is not particularly limited as long as it is a carboxyl group-containing polyurethane which has an aromatic ring concentration of 0.1 to 6.5 mmol/g and contains an organic residue derived from a polyisocyanate; however, component (a) preferably has at least either of the structural unit of formula (1) and the structural unit of formula (2).

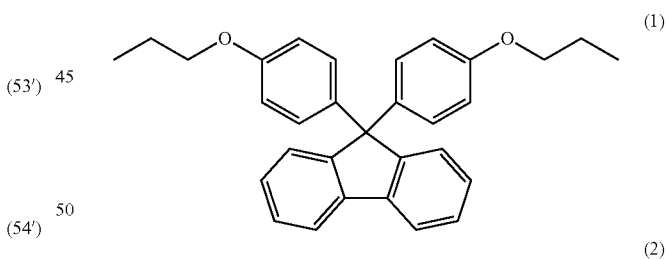

Further, it is preferable that a part or all of the structural unit of formula (2) exist in the polyurethane as a part of the structural unit represented by formula (3).

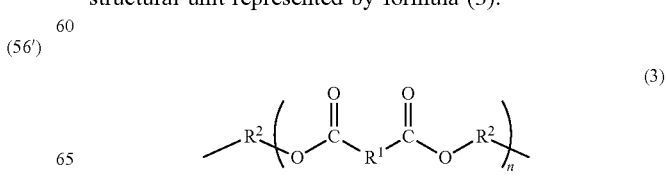

In formulae (2) and (3), $R^1$s each independently represent a phenylene group or a phenylene group having a substituent, preferably a phenylene group. Examples of the substituent include alkyl groups having 1 to 5 carbon atoms, halogen atoms, etc.

Examples of a compound having the structural unit of formula (1) include 9,9-his[4-(2-hydroxyethoxy)phenyl] fluorene represented by formula (4).

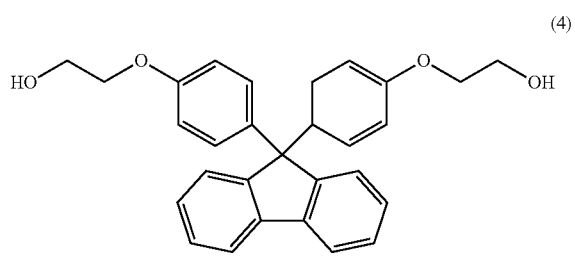

(4)

Examples of a compound having the structural unit of formula (3) include polyester polyols constituted by a combination of at least one selected from the group consisting of the below-described dicarboxylic acids and at least one selected from the group consisting of the below-described diols.

Examples of dicarboxylic acids include phthalic acid, isophthalic acid, terephthalic acid, 3-methyl-benzene-1,2-dicarboxylic acid, 4-methyl-benzene-1,2-dicarboxylic acid, 4-methyl-acid, 5-methyl-benzene-1,3-dicarboxylic acid, 2-methyl-benzene-1,4-dicarboxylic acid, and the like, and any one of these dicarboxylic acids may be used singly, or two or more of these dicarboxylic acids may be used in combination.

Further, examples of diols include 1,3-propanediol, 1,2-propanediol, 1,4-butanediol, 1,5-pentanediol, 1,6-hexanediol, 3-methyl-1,5-pentanediol, 1,8-octanediol, 1,9-nonanediol, 2,4-diethyl-1,5-pentanediol, 2-ethyl-2-butyl-1,3-propanediol, and the like, and any one of these diols may be used singly, or two or more of these diols may be used in combination.

Examples of preferable dicarboxylic acids include phthalic acid, isophthalic acid, terephthalic acid, 3-methyl-benzene-1,2-dicarboxylic acid and 4-methyl-benzene-1,2-dicarboxylic acid, and phthalic acid is particularly preferable.

Examples of preferable diols include 1,3-propanediol, 1,4-butanediol, 1,5-pentanediol, 1,6-hexanediol and 3-methyl-1,5-pentanediol, and 1,6-hexanediol and 3-methyl-1,5-pentanediol are particularly preferable.

As a polyester polyol having the structural unit of formula (3), it is preferable to use one having a number-average molecular weight of 800 to 5,000, more preferably 800 to 4,000, particularly preferably 900 to 3,500.

As the polyester polyol having the structural unit of formula (3), a polyester polyol may be used singly, or two or more thereof may be used in combination.

The carboxyl group-containing diol used as a raw material of component (a) is not particularly limited as long as it is a compound which has one or more carboxyl groups and two alcoholic hydroxyl groups in the molecule. Specific examples of such a carboxyl group-containing diol include dimethylolpropionic acid, 2,2-dimethylolbutanoic acid, N,N-bis(hydroxyethyl)glycine, and N,N-bis(hydroxyethyl) glycine. Thereamong, from the standpoint of the solubility in the solvent used for the synthesis reaction of component (a), dimethylolpropionic acid and 2,2-dimethylolbutanoic acid are particularly preferable. These carboxyl group-containing diols may be used individually, or in combination of two or more thereof.

When a low-molecular-weight polyol is used as a polyol other than the polyester polyol having the structural unit of formula (31) and the carboxyl group-containing diol, for example, 1,2-propanediol, 1,3-butanediol, 1,4-butanediol, 3-methyl-1,5-pentanediol, 1,6-hexanediol, 1,4-cyclohexane dimethanol, neopentyl glycol, diethylene glycol, dipropylene glycol, glycerin, trimethylolpropane, and the like can be used singly or in combination of two or more thereof, and it is preferable to use 1,6-hexanediol and/or 3-methyl-1,5-pentanediol.

The polyisocyanate compound used for the synthesis of component (a) is not particularly limited as long as it is a compound having two or more isocyanato groups. Specific examples of the polyisocyanate compound include cyclic aliphatic diisocyanates, such as 1,3-cyclohexane diisocyanate, 1,4-cyclohexane diisocyanate, isophorone diisocyanate, methylenebis(4-cyclohexylisocyanate), 1,3-bis(isocyanatomethyl)cyclohexane, 1,4-bis(isocyanatomethyl) cyclohexane, norbornene diisocyanate, and biuret of isophorone diisocyanate; aromatic ring-containing polyisocyanates, such as 2,4-tolylene diisocyanate, 2,6-tolylene diisocyanate, diphenylmethane-4,4'-diisocyanate, diisocyanate, and 1,4-xylylene diisocyanate; chain aliphatic polyisocyanates, such as biuret of hexamethylene diisocyanate, lysine triisocyanate, lysine diisocyanate, hexamethylene diisocyanate, 2,4,4-trimethylhexamethylene diisocyanate, and 2,2,4-trimethylhexamethylene diisocyanate; and heterocycle-containing polyisocyanates, such as isocyanurate of isophorone diisocyanate and isocyanurate of hexamethylene diisocyanate, and these polyisocyanate compounds may be used singly, or in combination of two or more thereof.

Thereamong, in order to maintain high heat resistance as well as high electrical insulation performance of the below-described cured product of the present invention (II), a cyclic aliphatic polyisocyanate is incorporated in an amount of preferably not less than 70% by mole (i.e., the amount of an organic residue derived from the cyclic aliphatic polyisocyanate in component (a) is not less than 70% by mole based on the total amount of organic residues derived from polyisocyanates), more preferably not less than 80% by mole, particularly preferably not less than 90% by mole, based on the total isocyanate amount.

Among cyclic aliphatic polyisocyanates, isophorone diisocyanate, methylenebis(4-cyclohexylisocyanate), 1,3-bis (isocyanatomethyl)cyclohexane, bis(isocyanatomethyl)cyclohexane and norhomane diisocyanate are preferable, methylenebis(4-cyclohexylisocyanate), isophorone diisocyanate and norhomane diisocyanate are more preferable, and methylenebis(4-cyclohexylisocyanate) is most preferable.

The monohydroxyl compound that is used as a raw material of component (a) as required is not particularly limited as long as it is a compound which has one alcoholic hydroxyl group in the molecule and contains no other substituent that is more reactive with an isocyanato group than the alcoholic hydroxyl group. Specific examples of the monohydroxyl compound include methanol, ethanol, n-propanol, isopropanol, n-butanol, isobutanol, sec-butanol, t-butanol, ethylene glycol monoethyl ether, diethylene glycol monoethyl ether, diethylene glycol monoisopropyl ether, diethylene glycol monoisobutyl ether, dipropylene glycol monopropyl ether, and methyl ethyl ketoxime.

These monohydroxyl compounds may be used singly, or in combination of two or more thereof.

As the monoisocyanate compound used as a raw material of component (a) as required, for example, cyclohexyl isocyanate, octadecyl isocyanate, phenyl isocyanate, and tolyl isocyanate can be used. Taking into consideration the discoloration resistance of the curable composition of the present invention (I) during heating, cyclohexyl isocyanate and octadecyl isocyanate are preferable.

In order to maintain high electrical insulation performance and high heat resistance of the below-described cured product of the present invention (II), it is preferable that an aromatic ring(s) be incorporated on the side of the polyol used as a raw material, and it is most preferable that the polyisocyanate used as a raw material contain no aromatic ring (i.e., a polyisocyanate having an aromatic ring is not used as a raw material). In the method of producing component (a), the blending amounts of the respective components are as follows.

When a compound having the structural unit of formula (1) is used, the compound having the structural unit of formula (1) is used in an amount of preferably 3 to 20% by mass, more preferably 5 to 15% by mass, based on the total amount of the raw materials of component (a). When the compound having the structural unit of formula (1) is used in an amount of 3 to 20% by mass based on the total amount of the raw materials of component (a), a good balance between the low warpage and the wiring breakage-inhibiting effect can be attained for a flexible wiring board covered with the below-described overcoat film of the present invention.

When a polyester polyol having the structural unit of formula (3) is used, the polyester polyol having the structural unit of formula (3) is used in an amount of preferably 30 to 70% by mass, more preferably 35 to 70% by mass, particularly preferably 40 to 70% by mass, based on the total amount of the raw materials of component (a). When the polyester polyol having the structural unit of formula (3) is used in an amount of 30 to 70% by mass based on the total amount of the raw materials of component (a), since the elastic modulus of the below-described overcoat film is not excessively reduced and the resulting cured film thus does not become excessively fragile, a well-balanced overcoat film can be obtained.

In the production of component (a), the solid concentration is preferably 10 to 90% by mass, more preferably 15 to 70% by mass, particularly preferably 20 to 60% by mass. When a solution having a solid concentration of 20 to 60% by mass is used to produce the below-described curable composition of the present invention (I), from the standpoint of attaining uniform dispersion, the solution viscosity of the component (a) solution is preferably, for example, 5,000 to 1,000,000 mPa·s under the measurement conditions described in Examples.

The order of adding raw materials to a reaction vessel in the production of component (a) is not particularly limited; however, for example, the compound of formula (4), a polyester polyol having the structural unit of formula (3), a carboxyl group-containing diol and, as required, a polyol other than the compound of formula (4), the polyol having the structural unit of formula (3) and the carboxyl group-containing diol are first added to a reaction vessel and dissolved in a solvent. Then, a polyisocyanate compound is added dropwise to the resultant at a temperature of usually 20° C. to 140° C., more preferably 60° C. to 120° C., after which the above-described components are allowed to react with each other at a temperature of 50° C. to 160° C., preferably 60° C. to 150° C.

The molar ratio of the raw materials to be added is adjusted in accordance with the molecular weight and the acid value of the targeted component (a). The molecular weight of the targeted component (a) can also be adjusted using a monohydroxyl compound. In other words, a monohydroxyl compound can be added when component (a) has attained (or has come close to attaining) the targeted number-average molecular weight, for the purposes of capping terminal isocyanato groups and inhibiting a further increase in the number-average molecular weight.

When a monohydroxyl compound is used, there is no problem at all regardless of whether the number of isocyanato groups of the polyisocyanate compound is less than, equal to, or greater than the total number of hydroxyl groups contained in the raw materials of component (a) including the compound of formula (4), the polyester polyol having the structural unit of formula (3), and the polyol component other than the compound of formula (4) and the polyol having the structural unit of formula (3).

When a monohydroxyl compound is used in excess, unreacted monohydroxyl compound will remain as a result. In such a case, the excess monohydroxyl compound may be directly used as a part of the solvent, or may be removed by distillation or the like.

Further, for the use of a monoisocyanate compound as a raw material of component (a), it is required that the value obtained by subtracting the number of isocyanate groups of the monoisocyanate compound from the number of isocyanato groups contained in all of the raw material components of component (a) (i.e., the total number of isocyanato groups of the polyisocyanate compound used as a raw material of component (a)) be smaller than the total number of alcoholic hydroxyl groups contained in all of the raw material components of component (a) such that the terminals of the polyurethane which is being produced prior to the use of the monoisocyanate compound in the reaction are converted to hydroxyl groups. Once the reaction between the alcoholic hydroxyl groups contained in all of the raw material components of component (a) and the isocyanato groups of the polyisocyanate compound used in component (a) is substantially completed, the monoisocyanate compound is added dropwise to a solution of the carboxyl group-containing polyurethane which is being produced at 30° C. to 150° C., preferably 70° C. to 140° C., so as to allow the hydroxyl groups remaining at the terminals of the polyurethane which is being produced to react with the monoisocyanate compound, and the resulting solution is subsequently maintained at the same temperature to complete the reaction.

The number-average molecular weight of component (a) obtained in the above-described manner is preferably 3,000 to 100,000, more preferably 5,000 to 50,000, particularly preferably 5,000 to 30,000. When the number-average molecular weight is 5,000 to 100,000, the elasticity, flexibility and strength of the resulting cured film are not impaired, and component (a) exhibits good solubility in solvents i.e., component (b)) and does not yield an excessively viscous solution when dissolved; therefore, the curable composition of the present invention (I) can be suitably used in the production of a flexible wiring board covered with the below-described flexible wiring board overcoat film of the present invention.

The term "number-average molecular weight" used herein refers to a number-average molecular weight in terms of polystyrene that is measured by gel permeation chromatography (hereinafter referred to as "GPC").

In the present specification, unless otherwise specified, the GPC measurement conditions are as follows.

Apparatus: HPLC unit HSS-2000, manufactured by JASCO Corporation
Column: SHODEX column LF-804
Mobile phase: tetrahydrofuran
Flow rate: 1.0 mL/min
Detector: RI-2031 Plus, manufactured by JASCO Corporation
Temperature: 40.0° C.
Sample amount: Sample Loop 100 µL
Sample concentration: adjusted to be about 0.1% by mass The acid value of component (a) is preferably 10 to 70 mg-KOH/g, more preferably 10 to 50 mg-KOH/g. When the acid value is 10 to 70 mg-KOH/g, not only the reactivity of component (a) with other components contained in the curable composition of the present invention (I), such as the below-described compound having two or more epoxy groups in one molecule (i.e., component (c)), is not deteriorated, but also the heat resistance of the below-described cured product of the present invention (II) is not reduced and the cured product is not made excessively hard and fragile. In addition, a good balance can be easily attained between the solvent resistance of the below-described overcoat film and the warpage of the below-described flexible wiring board of the present invention (IV).

It is noted here that, in the present specification, the acid value of component (a) is an acid value measured by a potentiometric titration method in accordance with :us K0070.

<Component (b)>

The solvent which is one of the indispensable component of the curable composition of the present invention (I) is not particularly limited as long as it is capable of dissolving component (a); however, the solvent is preferably one which has a boiling point of 150° C. to 250° C. under atmospheric pressure. In terms of attaining a good balance in the solubility of component (a), the volatility of the solvent and the like, it is possible and preferable to use a combination of two or more solvents having a boiling point of 150° C. to 250° C. under atmospheric pressure. It is more preferable to use a solvent having a boiling point of not less than 170° C. and less than 200° C. under atmospheric pressure in combination with a solvent having a boiling point of not less than 200° C. and not more than 220° C. under atmospheric pressure.

Examples of the solvent having a boiling point of not less than 170° C. and less than 200° C. under atmospheric pressure include diethylene glycol diethyl ether (boiling point: 189° C.), diethylene glycol ethyl methyl ether (boiling point: 176° C.), dipropylene glycol dimethyl ether (boiling point: 171° C.), 3-methoxybutyl acetate (boiling point: 171° C.), ethylene glycol monobutyl ether acetate (boiling point: 192° C.), and the like.

Examples of the solvent having a boiling point of not less than 200° C. and not more than 220° C. under atmospheric pressure include diethylene glycol butylmethyl ether (boiling point: 212° C.), tripropylene glycol dimethyl ether (boiling point: 215° C.), triethylene glycol dimethyl ether (boiling point: 216° C.), ethylene glycol dibutyl ether (boiling point: 203° C.), diethylene glycol monoethyl ether acetate (boiling point: 217° C.), γ-butyrolactone (boiling point: 204° C.), and the like.

It is preferable to use at least one selected from diethylene glycol diethyl ether (boiling point: 189° C.), diethylene glycol ethyl methyl ether (boiling point: 176° C.) and dipropylene glycol dimethyl ether (boiling point: 171° C.) as the solvent having a boiling point of not less than 170° C. and less than 200° C. under atmospheric pressure in combination with γ-butyrolactone (boiling point: 204° C.) as the solvent having a boiling point of not less than 200° C. and not more than 220° C. under atmospheric pressure, since such a combination of solvents not only is highly volatile and can thus provide low-temperature curability but also enables to efficiently perform the synthesis reactions of component (a) in a uniform system. It is more preferable to use a combination of diethylene glycol diethyl ether (boiling point: 189° C.) and γ-butyrolactone (boiling point: 204° C.) as the solvent having a boiling point of not less than 170° C. and less than 200° C. under atmospheric pressure and the solvent having a boiling point of not less than 200° C. and not more than 220° C. under atmospheric pressure, respectively.

These preferable combinations of solvents have a low moisture absorption and a high boiling point with low volatility and are, therefore, also excellent as solvents of screen printing inks.

In order to allow the above-described effects to be sufficiently exerted, the usage ratio of the solvent having a boiling point of not less than 170° C. and less than 200° C. under atmospheric pressure and the solvent having a boiling point of not less than 200° C. and not more than 220° C. under atmospheric pressure is, in terms of mass ratio, preferably in a range of 5:95 to 80:20, more preferably in a range of 10:90 to 60:40.

Further, as a part of these preferable solvents, it is possible and preferable from the process standpoint to directly use the solvent used for the synthesis of component (a) as a part of the solvents of the curable composition of the present invention (1).

Additionally, a solvent other than the solvent having a boiling point of not less than 170° C. and less than 200° C. under atmospheric pressure and the solvent having a boiling point of not less than 200° C. and not more than 220° C. under atmospheric pressure may be used in combination within a range that does not impair the solubility of component (a). A reactive monomer and a reactive diluent can also be used as a solvent.

The content of component (h) in the curable composition of the present invention (I) is preferably 25 to 75% by mass, more preferably 35 to 70% by mass, particularly preferably 35 to 65% by mass, based on the total amount of components (a) and (b) and below-described components (c) and (d) that are components of the curable composition of the present invention (I) (or, based on the total amount of components (a), (b) and (c) when the curable composition of the present invention (I) does not comprise the component (d)). When the content of component (b) is in a range of 25 to 75% by mass based on the total amount of components (a), (b), (c) and (d) that are components of the curable composition of the present invention (I) (or, based on the total amount of components (a), (b) and (c) when the curable composition of the present invention (I) does not comprise component (d)), the curable composition has a viscosity favorable for printing by a screen printing method and does not much spread due to bleeding after being screen-printed; therefore, as a result, the actual printing area of the curable composition is kept from being excessively larger than the part desired to be coated with the curable composition (i.e., the shape of a printing plate).

<Component (c)>

Component (c), which is an indispensable component of the curable composition of the present invention (I), is not particularly limited as long as it is a compound having two or more epoxy groups in one molecule, and component (c) functions as a curing agent in the curable composition of the present invention (I).

Examples of the compound having two or more epoxy groups in one molecule include:

novolac-type epoxy resins such as phenol novolac-type epoxy resins and o-cresol novolac-type epoxy resins. Which are produced by epoxidation of a novolac resin obtained by condensation or co-condensation of a phenol (e.g., phenol, cresol, xylenol, resorcin, or catechol) and/or a naphthol (e.g., α-naphthol, β-naphthol, or dihydroxynaphthalene) with an aldehyde group-containing compound (e.g., formaldehyde, acetaldehyde, propionaldehyde, benzaldehyde, or salicylaldehyde) in the presence of an acid catalyst;

diglycidyl ethers of bisphenol A, bisphenol F, bisphenol S, alkyl-substituted or unsubstituted biphenols, and stilbene-based phenols (bisphenol A-type epoxy compounds, bisphenol F-type epoxy compounds, bisphenol S-type epoxy compounds, biphenyl-type epoxy compounds, and stilbene-type epoxy compounds);

glycidyl ethers of alcohols, such as butanediol, polyethylene glycol and polypropylene glycol;

glycidyl ester-type epoxy resins of carboxylic acids, such as phthalic acid, isophthalic acid and tetrahydrophthalic acid;

glycidyl-type or methylglycidyl-type epoxy resins, such as compounds obtained by substitution of an active hydrogen(s) bound to a nitrogen atom(s) of aniline, bis(4-aminophenyl)methane, isocyanuric acid or the like with a glycidyl group(s);

glycidyl-type or methylglycidyl-type epoxy resins, such as compounds obtained by substitution of an active hydrogen bound to the nitrogen atom and an active hydrogen of the phenolic hydroxyl group that are contained in an aminophenol (e.g., p-aminophenol) with glycidyl groups;

alicyclic epoxy resins obtained by epoxidation of an intramolecular olefin bond, such as vinylcyclohexene diepoxide, 3,4-epoxycyclohexylmethyl-3,4-epoxycyclohexane carboxylate, and 2-(3,4-epoxy)cyclohexyl-5,5-spiro(3,4-epoxy)cyclohexane-m-dioxane;

glycidyl ethers of para-xylylene and/or meta-xylylene-modified phenolic resins;

glycidyl ethers of terpene-modified phenolic resins;

glycidyl ethers of dicyclopentadiene-modified phenolic resins;

glycidyl ethers of cyclopentadiene-modified phenolic resins;

glycidyl ethers of polycyclic aromatic ring-modified phenolic resins;

glycidyl ethers of naphthalene ring-containing phenolic resins;

halogenated phenol novolac-type epoxy resins;

hydroquinone-type epoxy resins;

trimethylolpropane-type epoxy resins;

linear aliphatic epoxy resins obtained by oxidation of an olefin bond with a peracid such as peracetic acid;

diphenylmethane-type epoxy resins;

epoxidation products of aralkyl-type phenolic resins, such as phenol aralkyl resins and naphthol aralkyl resins;

sulfur atom-containing epoxy resins;

diglycidyl ether of tricyclo[5.2.1.0$^{2,6}$]decane dimethanol; and epoxy resins having an adamantane structure, such as 1,3-bis(1-adamantyl)-4,6-bis(glycidyloyl)benzene, 1-[2',4'-bis(glycidyloyl)phenyl]adamantane, 1,3-bis(4'-glycidyloylphenyl)adamantane, and 1,3-bis[2',4'-bis(glycidyloyl)phenyl]adamantane.

Thereamong, compounds that have two or more epoxy groups and an aromatic ring structure and/or an alicyclic structure in one molecule are preferable.

When a great importance is placed on the long-term electrical insulation performance of the below-described cured product of the present invention (II), among those compounds that have two or more epoxy groups and an aromatic ring structure and/or an alicyclic structure in one molecule, ones having a tricyciodecane structure and an aromatic ring structure along with two or more epoxy groups, examples of which include glycidyl ethers of dicyclopentadiene-modified phenolic resins (i.e., compounds that have a tricyclo[5.2.1.0$^{2,6}$] decane structure and an aromatic ring structure along with two or more epoxy groups) and epoxy resins having an adamantane structure, such as 1,3-bis(1-adamantyl)-4,6-bis(glycidyloyl)benzene, 1-[2',4'-bis(glycidyloyl)phenyl]adamantane, 1,3-bis(4'-glycidyloylphenyl)adamantane and 1,3-bis[2',4'-bis(glycidyloyl)phenyl]adamantane (i.e., compounds that have a tricyclo[3.3.1.1$^{3,7}$]decane structure and an aromatic ring structure along with two or more epoxy groups), are preferable since such compounds can yield cured products having low water absorption, and a compound of following formula (5) is particularly preferable.

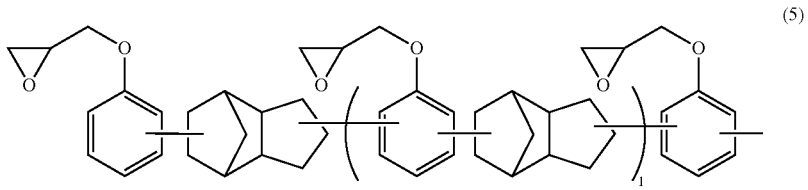

(5)

wherein l represents a natural number.

Meanwhile, when a great importance is placed on the reactivity with component (a), among those compounds that have two or more epoxy groups and an aromatic ring structure and/or an alicyclic structure in one molecule, ones having an amino group and an aromatic ring structure along with two or more epoxy groups, examples of which include glycidyl-type or methylglycidyl-type epoxy resins, such as compounds obtained by substitution of an active hydrogen bound to a nitrogen atom of aniline or bis(4-aminophenyl)methane with a glycidyl group and compounds obtained by substitution of an active hydrogen bound to the nitrogen atone and an active hydrogen of the phenolic hydroxyl group that are contained in an aminophenol (e.g., p-aminophenol) with glycidyl groups, are preferable, and a compound of following formula (6) is particularly preferable.

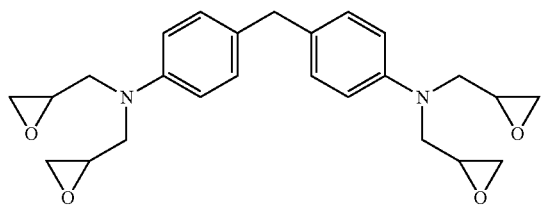

(6)

Component (c) may be used singly, or two or more thereof may be used in combination.

The amount of component (c) to be incorporated based on 100 parts by mass of component (a) that is an indispensable component of the curable composition of the present invention (I) cannot be generalized herein since it varies depending on the amount of the functional groups contained in component (a), such as carboxyl groups, that are capable of reacting with epoxy groups.

However, the ratio between the number of the functional groups contained in component (a), such as carboxyl groups, that are capable of reacting with epoxy groups and the number of the epoxy groups contained in component (c) (a compound having two or more epoxy groups in one molecule) (i.e., functional groups capable of reacting with epoxy groups/epoxy groups) is in a range of preferably ⅓ to 2/1, more preferably 1/2.5 to 1.5/1. With the above-described ratio being in a range of ⅓ to 2/1, when the curable composition of the present invention (I) is cured, the functional groups such as carboxyl groups that are capable of reacting with epoxy groups can react with the epoxy groups contained in component (c) (a compound having two or more epoxy groups in one molecule) in a well-balanced manner, without yielding a large amount of residual unreacted component (c) or leaving a large amount of unreacted functional groups such as carboxyl groups that are capable of reacting with the epoxy groups.

In the curable composition of the present invention (I), the amount of component (c) is 1 to 60% by mass, preferably 2 to 50% by mass, more preferably 3 to 40% by mass, based on the total amount of components (a) and (c) contained in the curable composition. When the amount of component (c) in the curable composition of the present invention (I) is in a range of 1 to 60% by mass based on the total amount of components (a) and (c) contained in the curable composition, a good balance can be attained between the solvent resistance of the below-described overcoat film of the present invention and the low warpage and wiring breakage-inhibiting effect of a flexible wiring board that is characterized by being covered with the overcoat film.

The curable composition of the present invention (I) may, and preferably does, further contain following component (d):

(component (d)) at least one particulate selected from the group consisting of an inorganic particulate and organic particulate.

Examples of the inorganic particulate include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), lead titanate ($PbO.TiO_2$), lead zirconate titanate (PZT), lead lanthanum zirconate titanate (PLZT), gallium oxide ($Ga_2O_3$), spinel (MgO. $Al_2O_3$), mullite ($3Al_2O_3.2SiO_2$), cordierite ($2MgO.2Al_2O_3.5SiO_2$), talc ($3MgO.4SiO_2.H_2O$), aluminum titanate ($TiO_2-Al_2O_3$), yttria-containing zirconia ($Y_2O_3$-$ZrO_2$), barium silicate ($BaO.8SiO_2$), boron nitride (BN), calcium carbonate ($CaCO_3$), calcium sulfate ($CaSO_4$), zinc oxide (ZnO), magnesium titanate ($MgO.TiO_2$), barium sulfate ($BaSO_4$), organic bentonite, carbon (C), hydrotalcite, and the like, and these may be used singly, or in combination of two or more thereof.

As the organic particulate, particulates of heat-resistant resins having an amide bond, an imide bond, an ester bond or an ether bond are preferable. From the standpoints of heat resistance and mechanical properties, preferable examples of such resins include polyimide resins and precursors thereof; polyamide-imide resins and precursors thereof; and polyamide resins.

Thereamong, component (d) preferably comprises at least one particulate selected from a silica particulate and hydrotalcite particulate.

It is herein defined that the silica particulate used in the curable composition of the present invention (I) encompass those which are in a powder form and have been physically coated or chemically surface-treated with an organic compound.

The silica particulate used in the curable composition of the present invention (I) are not particularly limited as long as they can be dispersed in the curable composition of the present invention (I) to form a paste, and examples thereof include AEROSIL available from Nippon Aerosil Co., Ltd.

Such a silica particulate represented by AEROSIL may be used for imparting printability in screen printing and, in that case, the silica particulate are used for the purpose of imparting thixotropy.

The hydrotalcite particulate used in the curable composition of the present invention (I) are composed of a layered inorganic compound that is a type of naturally-occurring clay mineral represented by, for example, $Mg_6Al_2(OH)_{16}CO_3.4H_2O$. A hydrotalcite represented by $Mg_{1-x}Al_x(OH)_2(CO_3)_{x/2}.mH_2O$ or the like can be synthesized as well. In other words, hydrotalcite is an Mg/Al-based layered compound capable of fixing anions such as chloride ions ($Cl^-$) and/or sulfate ions ($SO_4^-$) by ion exchange with interlayer carbonate groups. Taking advantage of this function, hydrotalcite can be used for the purpose of improving the insulation reliability by capturing chloride ions ($Cl^-$) and sulfate ions ($SO_4^-$) that cause migration of copper and tin.

Examples of commercially available hydrotalcite include STABIACE HT-1, STABIACE HT-7 and STABIACE FIT-P, which are manufactured by Sakai Chemical Industry Co., Ltd.; and DHT-4A, DHT-4A2 and DHT-4C, which are manufactured by Kyowa Chemical Industry Co., Ltd.

These inorganic particulates and/or organic particulates have an average particle size of preferably 0.01 to 10 μm, more preferably 0.1 to 5 μm.

Component (d) is incorporated in an amount of 0.1 to 60% by mass, preferably 0.3 to 55% by mass, more preferably 0.5 to 40% by mass, based on the total amount of components (a), (b), (c) and (d). When the amount of component (d) is in a range of 0.1 to 60% by mass based on the total amount of components (a), (b), (c) and (d), the curable composition has a viscosity favorable for printing by a screen printing method and thus does not much spread due to bleeding after being screen-printed; therefore, as a result, the actual printing area of the curable composition is kept from being excessively larger than the part desired to be coated with the curable composition (i.e., the shape of a printing plate), which is preferable.

<Curing Accelerator>

The curable composition of the present invention (I) may, and preferably does, further contain a curing accelerator.

The curing accelerator is not particularly limited as long as it is a compound that facilitates the reaction between the epoxy groups of component (c) and the carboxyl group of component (a). Examples of the curing accelerator include triazine compounds, such as melamine, acetoguanamine, benzoguanamine, 2,4-diamino-6-methacryloyloxyethyl-s-triazine, 2,4-methacryloyloxyethyl-s-triazine, 2,4-diamino-6-vinyl-s-triazine, and 2,4-diamino-6-vinyl-s-triazine isocyanuric acid adduct; imidazole compounds, such as imidazole, 2-methylimidazole, 2-ethyl-4-methylimidazole, 2-phenylimidazole, 2-undecylimidazole, 2-heptadecylimidazole, 1-benzyl-2-methylimidazole, 2-phenyl-4-methylimidazole, 1-cyanoethyl-2-methylimidazole, 1-cyanoethyl-2-ethyl-4-methylimidazole, 1-aminoethyl-2-ethyl-4-methylimidazole, 1-aminoethyl-2-methylimidazole, 1-(cyanoethylaminoethyl)-2-methylimidazole, N-[2-(2-methyl-1-imidazolyl)ethyl]urea, 1-cyanoethyl-2-undecylimidazole, 1-cyanoethyl-2-methylimidazolium trimellitate, 1-cyanoethyl-2-phenylimidazolium trimellitate, 1-cyanoethyl-2-ethyl-4-methylimidazolium trimellitate, 1-cyanoethyl-2-undecylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl4-methylimidazolyl-(1')]-ethyl-s-triazine, 1-dodecyl-2-methyl-3-benzylimidazolium chloride, N,N'-bis(2-methyl-1-imidazolylethyl)urea, N,N'-bis(2-methyl-1-imidazolylethl)adipamide, 2-phenyl-4-methyl-5-hydroxymethylimidazole, 2-phenyl-4,5-dihydroxymethylimidazole, 2-methylimidazole isocyanuric acid adduct, 2-phenylimidazole isocyanuric acid adduct, 2,4-diamino-6-[2'-methylimidazolyl-(1')-ethyl-s-triazine isocyanuric acid adduct, 2-methyl-4-formylimidazole, 2-ethyl-4-methyl-5-formylimidazole, 2-phenyl-4-methylformylimidazole, 1-benzyl-2-phenylimidazole, 1,2-dimethylimidazole, 1-(2-hydroxyethyl)imidazole, vinylimidazole, 1-methylimidazole, 1-allylimidazole, 2-ethylimidazole, 2-butylimidazole, 2-butyl-5-hydroxymethylimidazole, 2,3-dihydro-1H-pyrrolo[1,2-albenzimidazole, 1-benzyl-2-phenylimidazole hydrobromide, and 1-dodecyl-2-methyl-3-benzylimidazolium chloride; cycloamidine compounds and derivatives thereof, such as diazabicycloalkenes (e.g., 1,5-diazabicyclo(4.3.0)nonene-5 and salts thereof, and 1,8-diazabicyclo(5.4.0)undecene-7 and salts thereof); tertiary amino group-containing compounds, such as triethylenediamine, benzyldimethylamine, triethanolamine, dimethylaminoethanol, and tris(dimethylaminomethyl)phenol; organic phosphine compounds, such as triphenylphosphine, diphenyl(p-tolyl)phosphine, tris(alkylphenyl)phosphine, tris(alkoxyphenyl)phosphine, tris(alkylalkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkylphosphine, dialkylarylphosphine, and alkyldiarylphosphine; and dicyandiazide.

These curing accelerators may be used singly, or in combination of two or more thereof.

Among these curing accelerators, taking into consideration the balance between the curing acceleration effect and the electrical insulation performance of the below-described cured product of the present invention (II), melamine, imidazole compounds, cycloamidine compounds, derivatives of cycloamidine compounds, phosphine compounds and amine compounds are preferable, and melamine, 1,5-diazabicyclo(4.3.0)nonene-5 and salts thereof as well as 1,8-diazabicyclo(5.4.0)undecene-7 and salts thereof are more preferable.

The amount of the curing accelerator to be added is not particularly limited as long as a curing acceleration effect can be attained. However, from the standpoints of the curability of the curable composition of the present invention (I) as well as the electrical insulation properties and the water resistance of the below-described cured product of the present invention (II), the curing accelerator is incorporated in a range of preferably 0.05 to 5 parts by mass, more preferably 0.1 to 3 parts by mass, based on a total of 100 parts by mass of components (a) and (c) that are indispensable components of the curable composition of the present invention (I). When the amount is in a range of 0.05 to 5 parts by mass, not only the curable composition of the present invention (I) can be cured in a short time, but also the below-described cured product of the present invention (II) that is obtained by curing the composition has good electrical insulation properties and water resistance.

<Other Components>

A cured product having good electrical insulation properties can be obtained by curing the curable composition of the present invention (I); therefore, the curable composition of the present invention (I) can be used in, for example, resist ink applications for insulating protection of wirings.

When the curable composition of the present invention (I) is used as a resist ink composition for insulating protection of wiring (i.e., as a wiring board overcoat agent), it is possible and preferable to use an antifoaming agent for the purpose of eliminating bubbles or suppressing generation of bubbles during printing.

The antifoaming agent is not particularly limited as long as it literally has an effect of eliminating bubbles or suppressing generation of bubbles during printing of the wiring board overcoat agent.

Specific examples of the antifoaming agent used in the curable composition of the present invention (I) include silicone-based antifoaming agents, such as BYK-077 (manufactured by BYK Japan K.K.), SN-DEFOAMER 470 (manufactured by San Nopco Ltd.), TSA750S (manufactured by Momentive Performance Materials Inc.), and SILICONE OIL SH-203 (manufactured by Dow Coming Toray Co., Ltd.); acrylic polymer-based antifoaming agents, such as DAPPO SN-348 (manufactured by San Nopco Ltd.), DAPPO SN-354 (manufactured by San Nopco Ltd.), DAPPO SN-368 (manufactured by San Nopco Ltd.), and DISPARLON 230HF (manufactured by Kusumoto Chemicals, Ltd.); acetylene diol-based antifoaming agent, such as SURFYNOL DF-110D (manufactured by Nissin Chemical Industry Co., Ltd.) and SURFYNOL DF-37 (manufactured by Nissin Chemical industry Co., Ltd.); and fluorine-containing silicone-based antifoaming agents such as FA-630.

The content of the antifoaming agent is preferably 0.01 to 5 parts by mass, more preferably 0.05 to 4 parts by mass, particularly preferably 0.1 to 3 parts by mass, based on a total of 100 parts by mass of components (a), (b), (c) and (d).

In the curable composition of the present invention (I), a surfactant such as a leveling agent, and a known colorant such as phthalocyanine blue, phthalocyanine green, iodine green, disazo yellow, crystal violet, carbon black or naphthalene black may also be incorporated as required.

Further, when it is necessary to prevent component (a) from being deteriorated by oxidation and discolored by heating, it is possible and preferable to add an antioxidant, such as a phenolic antioxidant, a phosphite-based antioxidant or a thioether-based antioxidant.

Moreover, as required, a flame retardant and a lubricant may be added as well.

The curable composition of the present invention (I) can be obtained by homogeneously kneading and mixing some or all of the formulated components using a roll mill, a bead mill or the like. In cases where some of the formulated components are mixed in advance, the remaining components can be mixed when the composition is actually used.

<Viscosity of Curable Composition of Present Invention (I)>

The curable composition of the present invention (I) has a viscosity at 25° C. of usually 10,000 to 100,000 mPa·s, preferably 20,000 to 60,000 mPa·s. In the present specification, the viscosity of the curable composition of the present invention (I) at 25° C. is measured using a cone/plate-type viscometer (DV-II+Pro, manufactured by Brookfield Engineering Laboratories. Inc.; spindle model: CPE-52) at a rotation speed of 10 rpm, at 7 minutes after the start of rotation.

<Thixotropy Index of Curable Composition of Present Invention (I)>

Further, when the curable composition of the present invention (I) is used as a resist ink composition for insulating protection of wiring (i.e., as a wiring board overcoat agent), in order to allow the curable composition of the present invention (I) to have good printing properties, it is desired to control the thixotropy index of the composition in a certain range.

The term "thixotropy index" used herein is defined as a ratio of a viscosity measured at a rotation speed of 1 rpm to a viscosity measured at a rotation speed of 10 rpm (viscosity at 1 rpm/viscosity at 10 rpm), wherein the viscosities are measured using a cone/plate-type viscometer (DV-III+-Pro, manufactured by Brookfield Engineering Laboratories, Inc.; spindle model: CPE-52) at a temperature of 25° C.

When the curable composition of the present invention (I) is used as a wiring board overcoat agent, in order to allow the curable composition of the present invention (I) to have good screen printing properties, the thixotropy index of the composition is preferably 1.1 or higher, more preferably in a range of 1.1 to 3.0, particularly preferably in a range of 1.1 to 2.5. When the curable composition of the present invention (I) is used as a wiring board overcoat agent, as long as the thixotropy index of the curable composition is 1.1 to 3.0, not only the curable composition, after being printed, can yield a uniform film thickness and maintain a printed pattern, but also the printed film of the composition has good antifoaming property.

[Present Invention (II)]

Next, the cured product of the present invention (II) will be described.

The present invention (II) is a cured product of the curable composition of the present invention (I), i.e., a cured product obtained by curing the curable composition of the present invention (I).

The present invention (III) is a flexible wiring board overcoat film including the cured product of the present invention (II).

The cured product of the present invention (II) and the overcoat film of the present invention (III) can be obtained by heating the curable composition of the present invention (I) and thereby allowing the curing reaction of the composition to proceed. A method of obtaining the cured product of the present invention (II) as a cured film is not particularly limited; and a cured film or an overcoat film can be obtained by performing the following steps:

(first step) the step of printing the curable composition of the present invention (I) on a substrate or the like to obtain a printed film; and (second step) the step of obtaining a cured film or an overcoat film by heat-curing, in an atmosphere of 100° C. to 170° C., the printed film obtained in the first step, or a printed film prepared by placing the printed film obtained in the first step in an atmosphere of 40° C. to 100° C. and thereby removing a part or all of the solvent contained therein through evaporation.

A method of printing the curable composition of the present invention (I) in the first step is not particularly limited, and a printed film can be obtained by applying the curable composition on a substrate or the like by, for example, a screen printing method, a roll coating method, a spraying method, or a curtain coating method.

The solvent-evaporating operation in the second step is an operation that is performed as required, and the heat-curing operation may be performed immediately after the operation of the first step, or the curing reaction and the solvent removal may be performed simultaneously. When the solvent-evaporating operation is performed prior to the heat-curing in the second step, the operation is performed at a temperature of usually 40° C. to 100° C., preferably 60° C. to 100° C., more preferably 70° C. to 90° C., taking into consideration the evaporation rate of the solvent and prompt transition to the heat-curing step. The duration of evaporating the solvent in the second step is not particularly limited; however, it is preferably 10 minutes to 120 minutes, more preferably 20 minutes to 100 minutes.

The temperature of the heat-curing performed in the second step is in a range of preferably 100° C. to 170° C., more preferably 105° C. to 160° C., still more preferably 110° C. to 150° C. The duration of the heat-curing performed in the second step is not particularly limited; however, it is in a range of preferably 20 minutes to 4 hours, more preferably 30 minutes to 2 hours.

[Present Inventions (IV) and (V)]

Lastly, the flexible wiring board according to the present invention (IV) and the method of producing a flexible wiring board according to the present invention (V) will be described. The curable composition of the present invention (I) can be used as, for example, a resist ink for insulating protection of wiring, and the cured product of the present invention (II) can be used as an insulating protective film. Particularly, for example, by covering a part or all of the wiring of a flexible wiring board such as a chip-on-film with the cured product of the present invention (II), the cured product can be used as a resist for insulating protection of wiring.

The present invention (IV) is a flexible wiring board including a wiring formed on a flexible substrate, wherein a part or all of a surface on which the wiring is formed is covered with the cured product of the present invention (II). The wiring covered with the cured product of the present invention (II) is preferably a tin-plated copper wiring, taking into consideration the antioxidation and economic aspects of the wiring.

The present invention (V) is a method of producing a flexible wiring board covered with a protective film, the method being characterized by comprising: printing the curable composition of the present invention (I) on at least a part of a wiring pattern section of a flexible wiring board to form a printed film on the pattern; and forming a protective film by heat-curing the thus formed printed film at 100 to 170° C.

A protective film of a flexible wiring board can be formed by, for example, performing following steps A to C:

(step A) the step of printing the curable composition of the present invention (I) on at least a part of a wiring pattern section of a flexible wiring board to form a printed film on the pattern;

(step B) the step of placing the printed film obtained in step A in an atmosphere of 40° C. to 100° C. to evaporate a part or all of the solvent contained in the printed film; and (step C) the step of heating and curing the printed film obtained in step A or the printed film obtained in step B at 100° C. to 170° C. to form a protective film of the flexible wiring board.

The present invention (V) is more preferably a method of producing a flexible wiring board covered with an overcoat film, comprising:

(step A) the step of printing the curable composition of the present invention (I) on a part or all of a surface of a flexible wiring board comprising a flexible substrate and a wiring formed on the flexible substrate, on which surface the wiring is formed, and thereby forming a printed film on the wiring;

(step B) the step of placing the printed film obtained in step A in an atmosphere of 40° C. to 100° C. to evaporate a part or all of the solvent contained in the printed film; and (step C) the step of heating and curing the printed film obtained in step A or the printed film obtained in step B at 100° C. to 170° C. to form an overcoat film.

The solvent-evaporating operation in step B is an operation that is performed as required, and the heat-curing operation may be performed immediately after the operation of step A, or the curing reaction and the solvent removal may be performed simultaneously. When the solvent-evaporating operation is performed prior to the heat-curing in step B, the operation is performed at a temperature of usually 40° C. to 100° C., preferably 60° C. to 100° C., more preferably 70° C. to 90° C., taking into consideration the evaporation rate of the solvent and prompt transition to the heat-curing step. The duration of evaporating the solvent in step B is not particularly limited; however, it is preferably 10 minutes to 120 minutes, more preferably 20 minutes to 100 minutes.

As for the conditions of the heat-curing performed in step B, from the standpoint of inhibiting diffusion of the resulting plating layer and attaining low warpage and flexibility suitable as a protective film, the heat-curing is performed in a range of 100° C. to 170° C. The heat-curing temperature is preferably 105° C. to 160° C., more preferably 110° C. to 150° C. The duration of the heat-curing performed in step B is not particularly limited; however, it is preferably 10 to 150 minutes, more preferably 15 to 120 minutes.

EXAMPLES

The present invention will now be described more concretely by way of examples thereof; however, the present invention is not limited to the following examples by any means.

<Measurement of Acid Value>

A solvent contained in a polyurethane solution used in the present invention (I) was removed by distillation under reduced pressure with heating to obtain component (a).

For component (a) obtained by this method, the acid value was measured in accordance with the potentiometric titration method of JIS K0070.

The apparatus used in the potentiometric titration method was as follows. Apparatus: automatic potentiometric titrator AT-510, manufactured by Kyoto Electronics Manufacturing Co., Ltd.

Electrode: composite glass electrode C-173, manufactured by Kyoto Electronics Manufacturing Co., Ltd.

<Measurement of Number-Average Molecular Weight of Component (a)>

The number-average molecular weight was measured by GPC in terms of polystyrene, and the GPC measurement conditions were as follows.

Apparatus: HPLC unit HSS-2000, manufactured by JASCO Corporation
Column: SHODEX Column LF-804
Mobile phase: tetrahydrofuran
Flow rate: 1.0 mL/min
Detector: RI-2031 Plus, manufactured by JASCO Corporation
Temperature: 40.0° C.
Sample amount: Sample Loop 100 μL
Sample concentration: adjusted to be about 0.1% by mass <Measurement of Viscosity of Component (a)-Containing Solution>

The viscosity of a polyurethane solution was measured by the following method.

Using a cone/plate-type viscometer (DV-II+Pro, manufactured by Brookfield Engineering Laboratories, Inc.; spindle model: CPE-52), the viscosity of about 0.8 g of the polyurethane solution at 7 minutes after the start of the measurement was determined at a temperature of 25.0° C. and a rotation speed of 5 rpm, <Measurement of Viscosity of Curable Composition>

The viscosity of a curable composition was measured by the following method.

Using a cone/plate-type viscometer (DV-II+Pro, manufactured by Brookfield Engineering Laboratories, Inc.; spindle model: CPE-52), the viscosity of about 0.6 g of the curable composition at 7 minutes after the start of the measurement was determined at a temperature of 25.0° C. and a rotation speed of 10 rpm.

<Measurement of Thixotropy Index>

The thixotropy index of a curable composition was determined by the following method.

Using a cone/plate-type viscometer (DV-II+Pro, manufactured by Brookfield Engineering Laboratories, Inc.; spindle model: CPE-52), the viscosity of about 0.6 g of the curable composition at 7 minutes after the start of the measurement was determined at a temperature of 25.0° C. and a rotation speed of 10 rpm. Then, the viscosity at 7 minutes after the start of the measurement was determined at a temperature of 25.0° C. and a rotation speed of 1 rpm.

The thixotropy index was calculated in the following manner. Calculation of thixotropy index:

Thixotropy index=[Viscosity at 1 rpm]÷[Viscosity at 10 rpm]

<Synthesis of Polyester Polyol>

Reference Synthesis Example 1

To a reaction vessel equipped with a stirrer, a thermometer and a condenser having a distillator, 983.5 g (6.74 mol) of phthalic anhydride and 879.2 g (7.44 mol) of 1,6-hexanediol were added, and the inner temperature of the reaction vessel was raised to 140° C. using an oil bath, followed by continuous stirring for 4 hours. Then, while continuously stirring the added materials, 1.74 g of mono-n-butyl tin oxide was further added, and the inner temperature of the reaction vessel was gradually raised. A vacuum pump was connected to the reaction vessel, and the pressure inside the reaction vessel was slowly reduced so as to remove water from the reaction vessel by distillation under reduced pressure. Eventually, the inner temperature was raised to 220° C. and the pressure was reduced to 133.32 Pa. The reaction was terminated after 15 hours when water was confirmed to have been completely removed by distillation. The hydroxyl value of the thus obtained polyester polyol (hereinafter referred to as "polyester diol (α)") was measured to be 53.1 mg-KOH/g.

<Synthesis of Polyurethanes>

Synthesis Example 1

To a reaction vessel equipped with a stirrer, a thermometer and a condenser, 10.7 g (24.4 mmol, aromatic ring: 97.6 mmol) of 9,9-bis[4-(2-hydroxyethoxy)phenyl]fluorene (manufactured by Osaka Gas Chemicals Co., Ltd., trade name: BPEF), 61.52 g of P-2030 (manufactured by Kuraray Co., Ltd., a polyester polyol composed of isophthalic acid/ 3-methyl-1,5-pentanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sutnika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 8 hours and, after confirming by an IR analysis that absorption of isocyanato group attributed to C=O stretching vibration was substantially no longer observed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A1") was obtained.

The thus obtained polyurethane solution A1 had a viscosity of 120,000 mPa·s. The carboxyl group-containing polyurethane having an aromatic ring concentration of 3.1 mmol/g (hereinafter referred to as "polyurethane AU1"), which was contained in the polyurethane solution A1, had a number-average molecular weight of 20,000 and an acid value of 25.0 mg-KOH/g.

Further, the polyurethane solution A1 had a solid concentration of 40.0% by mass.

Synthesis Example 2

To a reaction vessel equipped with a stirrer, a thermometer and a condenser, 10.7 g of 9,9-bis[4-(2-hydroxyethoxy) phenyl]fluorene (manufactured by Osaka. Gas Chemicals Co., Ltd., trade name: BPEF), 61.52 g of the above-described polyester diol (α) (polyester polyol composed of phthalic acid/1,6-hexandiol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 8 hours and, after confirming by an IR analysis that absorption of isocyanate group attributed to C=O stretching vibration was substantially no longer observed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A2") was obtained.

The thus obtained polyurethane solution A2 had a viscosity of 120,000 mPa·s. The carboxyl group-containing polyurethane having an aromatic ring concentration of 3.1 mmol/g (hereinafter referred to as "polyurethane AU2"), which was contained in the polyurethane solution A2, had a number-average molecular weight of 20,000 and an acid value of 25.0 mg-KOH/g.

Further, the polyurethane solution A2 had a solid concentration of 40.0% by mass.

Synthesis Example 3

To a reaction vessel equipped with a stirrer, a thermometer and a condenser, 10.7 g of 9,9-bis[4-(2-hydroxyethoxy) phenyl]fluorene (manufactured by Osaka Gas Chemicals Co., Ltd., trade name: BPEF), 30.76 g of P-2030 (manufactured by Kuraray Co., Ltd., a polyester polyol composed of isophthalic acid/3-methyl-1,5-pentanediol), 30.76 g of the above-described polyester diol (α) (polyester polyol composed of phthalic acid/1,6-hexandiol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Swnika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 8 hours and, after confirming by an IR analysis that absorption of isocyanato group attributed to C=O stretching vibration was substantially no longer observed, 1.5 g of ethanol (manufactured by Wako Pure Chemical Industries, Ltd.) and 24.3 g of diethylene glycol diethyl ether (manufactured by Nippon Nvukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A3") was obtained.

The thus obtained polyurethane solution A3 had a viscosity of 120,000 mPa·s. The carboxyl group-containing polyurethane having an aromatic ring concentration of 3.1 mmol/g (hereinafter referred to as "polyurethane AU3"), which was contained in the polyurethane solution A3, had a number-average molecular weight of 20,000 and an acid value of 25.0 mg-KOH/g.

Further, the polyurethane solution A3 had a solid concentration of 40.0% by mass.

Synthesis Example 4

To a reaction vessel equipped with a stirrer, a thermometer and a condenser, 10.7 g of 9,9-bis[4-(2-hydroxyethoxy)

phenyl]fluorene (manufactured by Osaka Gas Chemicals Co., Ltd., trade name: BPEF), 61.52 g of P-2020 (manufactured by Kuraray Co., Ltd., a polyester polyol composed of terephthalic acid/3-methyl-1,5-pentanediol), 6.48 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 28.31 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 8 hours and, after confirming by an IR analysis that absorption of isocyanato group attributed to C═O stretching vibration was substantially no longer observed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.1 mmol/g (hereinafter referred to as "polyurethane solution A4") was obtained.

The thus obtained polyurethane solution A4 had a viscosity of 120,000 mPa·s. The carboxyl group-containing polyurethane having an aromatic ring concentration of 3.1 mmol/g (hereinafter referred to as "polyurethane AU4"), which was contained in the polyurethane solution A4, had a number-average molecular weight of 20,000 and an acid value of 25.0 mg-KOH/g.

Further, the polyurethane solution A4 had a solid concentration of 40.0% by mass.

Synthesis Example 5

To a reaction vessel equipped with a stirrer, a thermometer and a condenser, 10.27 g of 9,9-bis[4-(2-hydroxyethoxy)phenyl]fluorene (manufactured by Osaka Gas Chemicals Co., Ltd., trade name: BPEF), 59.09 g of the above-described polyester diol (α) (polyester polyol composed of phthalic acid/1,6-hexanediol), 7.78 g of 2,2-dimethylolpropionic acid (manufactured by Tokyo Chemical Industry Co., Ltd.) as a carboxyl group-containing diol, and 137.7 g of γ-butyrolactone as a solvent were added, and these materials were heated to 100° C. and thereby completely dissolved.

The temperature of the resulting reaction solution was lowered to 90° C., and 29.87 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 8 hours and, after confirming by an IR analysis that absorption of isocyanato group attributed to C═O stretching vibration was substantially no longer observed, 1.5 g of ethanol (manufactured by Wako Pure Chemical Industries, Ltd.) and 24.3 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 3.0 mmol/g (hereinafter referred to as "polyurethane solution A5") was obtained.

The thus obtained polyurethane solution A5 had a viscosity of 120,000 mPa·s. The carboxyl group-containing polyurethane having an aromatic ring concentration of 3.0 mmol/g (hereinafter referred to as "polyurethane AU5"), which was contained in the polyurethane solution A5, had a number-average molecular weight of 20,000 and an acid value of 30.0 mg-KOH/g.

Further, the polyurethane solution A5 had a solid concentration of 40.0% by mass.

Synthesis Example 6

To a reaction vessel equipped with a stirrer, a thermometer and a condenser, 21.0 g of 9,9-bis[4-(2-hydroxyethoxy)phenyl]fluorene (manufactured by Osaka Gas Chemicals Co., Ltd., trade name: BPEF), 66.7 g of the above-described polyester diol (α) (polyester polyol composed of phthalic acid/1,6-hexanediol), 3.00 g of 2,2-dimethylolbutanoic acid (manufactured by Tokyo Chemical Industry Co., Ltd.) as a carboxyl group-containing diol, and 83.24 g of γ-butyrolactone as a solvent were added, and these materials were heated to 100° C. and thereby completely dissolved.

The temperature of the resulting reaction solution was lowered to 90° C., and a solution obtained by dissolving 26.50 g of diphenylmethane-4,4'-diisocyanate (manufactured by Tosoh Corporation, trade name: MILLION ATE MT) as a polyisocyanate compound in 60.0 g of γ-butyrolactone was added dropwise thereto over a period of 20 minutes using a dropping funnel. Reaction was allowed to proceed at 125° C. to 130° C. for 8 hours and, after confirming by an IR analysis that absorption of isocyanato group attributed to C═O stretching vibration was substantially no longer observed, 1.5 g of ethanol (manufactured by Wako Pure Chemical industries, Ltd.) and 6.19 g of γ-butyrolactone and 26.37 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 5.6 mmol/g (hereinafter referred to as "polyurethane solution A6") was obtained.

The thus obtained polyurethane solution A6 had a viscosity of 120,000 mPa·s. The carboxyl group-containing polyurethane having an aromatic ring concentration of 5.6 mmol/g (hereinafter referred to as "polyurethane AU6"), which was contained in the polyurethane solution A6, had a number-average molecular weight of 20,000 and an acid value of 10.6 mg-KOH/g.

Further, the polyurethane solution A6 had a solid concentration of 40.0% by mass.

Synthesis Example 7

To a reaction vessel equipped with a stirrer, a thermometer and a condenser, 5.0 g of 9,9-bis[4-(2-hydroxyethoxy)phenyl]fluorene (manufactured by Osaka Gas Chemicals Co., Ltd., trade name: BPEF), 73.00 g of a polycarbonate diol (polyester polyol composed of 3-methyl-1,5-pentanediol/1,6-hexanediol, trade name: KURARAY POLYOL C-2090, hydroxyl value: 1,955), 6.75 g of 2,2-dimethylolpropionic acid (manufactured by Tokyo Chemical Industry Co., Ltd.) as a carboxyl group-containing diol, and 136.34 g of γ-butyrolactone as a solvent were added, and these materials were heated to 100° C. and thereby completely dissolved.

The temperature of the resulting reaction solution was lowered to 90° C. and 26.80 g of methylenebis(4-cyclohexylisocyanate) (manufactured by Sumika Bayer Urethane Co., Ltd., trade name: DESMODUR-W) as a polyisocyanate compound was added dropwise thereto over a period of 30 minutes using a dropping funnel. Reaction was allowed to proceed at 145° C. to 150° C. for 10 hours and, after confirming by an IR analysis that absorption of isocyanato group attributed to C=O stretching vibration was substantially no longer observed, 1.5 g of ethanol (manufactured by Wako Pure Chemical Industries, Ltd.), 5.89 g of γ-butyrolactone and 25.10 g of diethylene glycol diethyl ether (manufactured by Nippon Nyukazai Co., Ltd.) were added dropwise, and reaction was allowed to further proceed at 80° C. for 3 hours, whereby a solution containing a carboxy group-containing polyurethane having an aromatic ring concentration of 0.4 mmol/g (hereinafter referred to as "polyurethane solution A7") was obtained.

The thus obtained polyurethane solution A7 had a viscosity of 120,000 mPa·s. The carboxyl group-containing polyurethane having an aromatic ring concentration of 0.4 mmol/g (hereinafter referred to as "polyurethane AU7"), which was contained in the polyurethane solution A7, had a number-average molecular weight of 20,000 and an acid value of 25.0 mg-KOH/g.

Further, the polyurethane solution A7 had a solid concentration of 40.0% by mass.

Comparative Synthesis Example 1

To a reaction vessel equipped with a stirrer, a thermometer and a condenser, 248.0 g of C-1090 (manufactured by Kuraray Co., Ltd., a (poly)carbonate diol obtained using 1,6-hexanediol and 3-methyl-1,5-pentanediol as materials, hydroxyl value: 122.22 mg-KOH/g) as a (poly)carbonate polyol, 47.5 g of 2,2-dimethylolbutanoic acid (manufactured by Nippon Kasei Chemical Co., Ltd.) as a carboxyl group-containing diol, 2.7 g of trimethylolethane (manufactured by Mitsubishi Gas Chemical Company, Inc.) as a polyol other than the (poly)carbonate polyol and carboxyl group-containing diol, and 467.5 g of γ-butyrolactone (manufactured by Mitsubishi Chemical Corporation) and 82.5 g of diethylene glycol diethyl ether (manufactured by Nippon Nyukazai Co., Ltd.) as solvents were added, and these materials were heated to 100° C. and thereby completely dissolved.

The temperature of the resulting reaction solution was lowered to 90° C., and 150.4 g of methylenebis(4-cyclohexylisocyanate) (manufactured by Sumika Bayer Urethane Co., Ltd., trade name: DESMODUR-W) as a diisocyanate compound was added dropwise thereto over a period of 30 minutes using a dropping funnel.

Reaction was allowed to proceed at 120° C. for 8 hours, and it was confirmed by an IR analysis that absorption of isocyanato group attributed to C=O stretching vibration was substantially no longer observed. Thereafter, 1.5 g of ethanol (manufactured by Wako Pure Chemical Industries, Ltd.) was added dropwise to the reaction solution, and reaction was allowed to further proceed at 80° C. for 3 hours, whereby a solution of a polyurethane having a carboxyl group and a carbonate bond (hereinafter referred to as "polyurethane solution B1") was obtained.

The thus obtained polyurethane solution B1 had a viscosity of 145,000 mPa·s. The polyurethane having an aromatic ring concentration of 0 mmol/g (hereinafter referred to as "polyurethane BU1"), which was contained in the polyurethane solution B1, had a number-average molecular weight of 14,000 and an acid value of 40.0 mg-KOH/g. Further, the polyurethane solution B1 had a solid concentration of 45.0% by mass.

Comparative Synthesis Example 2

To a 1-L three-necked flask equipped with a distillator, 611.0 g of bis[4-(2-hydroxyethoxy)phenyl]methane, 297.3 g of dimethyl isophthalate and 0.5 g of dioctyl tin oxide were added, and these materials were heated at 180° C. under a nitrogen gas flow to remove the resulting methanol by distillation. Once about 50 g of methanol was distilled, the methanol distillation rate was increased by reducing the pressure inside the reaction system to 1.3 kPa. After a theoretical amount of methanol was distilled, the reaction system was further heated for 1 hour and maintained at 185° C. and 0.13 kPa for 1 hour, followed by cooling of the reaction vessel, whereby 810 g of a polyester polyol (hereinafter referred to as "polyester diol (β)") was obtained. The hydroxyl value of the thus obtained polyester diol (β) was measured to be 55.4 mg-KOH/g.

To a reaction vessel equipped with a stirrer, a thermometer and a condenser, 11.0 g of 9,9-bis[4-(2-hydroxyethoxy) phenyl]fluorene (manufactured by Osaka Gas Chemicals Co., Ltd., trade name: BPEF), 61.52 g of the polyester diol (β), 6.32 g of 2,2-dimethylolpropionic acid (manufactured by Tokyo Chemical Industry Co., Ltd.) as a carboxyl group-containing diol, and 135.6 g of γ-butyrolactone as a solvent were added, and these materials were heated to 100° C. and thereby completely dissolved.

The temperature of the resulting reaction solution was lowered to 90° C., and 27.00 g of diphenylmethane-4,4'-diisocyanate (manufactured by Sumika Bayer Urethane Co., Ltd., trade name: MDI) as a polyisocyanate compound was added thereto in several portions over a period of 30 minutes using a dropping funnel. Reaction was allowed to proceed at 145° C. to 150° C. for 15 hours and, after confirming by an IR analysis that absorption of isocyanato group attributed to C=O stretching vibration was substantially no longer observed, 1.5 g of ethanol (manufactured by Wako Pure Chemical Industries, Ltd.) and 23.9 g of diethylene glycol diethyl ether (manufactured by Nippon Nyukazai Co., Ltd.) were added dropwise, and reaction was allowed to further proceed at 80° C. for 3 hours, whereby a solution containing a carboxyl group-containing polyurethane having an aromatic ring concentration of 6.9 mmol/g (hereinafter referred to as "polyurethane solution B2") was obtained.

The thus obtained polyurethane solution B2 had a viscosity of 125,000 mPa·s. The carboxyl group-containing polyurethane having an aromatic ring concentration of 6.9 mmol/g (hereinafter referred to as "polyurethane BU2"), which was contained in the polyurethane solution B2, had a number-average molecular weight of 20,000 and an acid value of 25.0 mg-KOH/g.

Further, the polyurethane solution B2 had a solid concentration of 40.0% by mass.

The properties of the polyurethanes AU1 to AU7, BU1 and BU2 are shown in Table 1.

TABLE 1

| Polyurethane | | AU1 | AU2 | AU3 | AU4 | AU5 | AU6 | AU7 | BU1 | BU2 |
|---|---|---|---|---|---|---|---|---|---|---|
| Molecular weight | | 20,000 | 20,000 | 20,000 | 20,000 | 20,000 | 20,000 | 20,000 | 14,000 | 20,000 |
| Acid value | mg-KOH/g | 25 | 25 | 25 | 25 | 30 | 10.6 | 25 | 40 | 25 |

TABLE 1-continued

| Polyurethane | | AU1 | AU2 | AU3 | AU4 | AU5 | AU6 | AU7 | BU1 | BU2 |
|---|---|---|---|---|---|---|---|---|---|---|
| Aromatic ring concentration | m-mol/g | 3.1 | 3.1 | 3.1 | 3.1 | 3.0 | 5.6 | 0.4 | — | 6.9 |

<Production of Main Agent Blends>

Blending Example 1

Using a three-roll mill (manufactured by Inoue MFG., Inc., type: S-4 3/4×11), 160.0 parts by mass of the polyurethane solution A1, 6.3 parts by mass of silica, powder (manufactured by Nippon Aerosil Co., Ltd., trade name: AEROSIL R-974), 0.72 parts by mass of melamine (manufactured by Nissan Chemical industries, Ltd.) as a curing accelerator, and 8.4 parts by mass of diethylene glycol diethyl ether were mixed to incorporate the silica powder and the curing accelerator into the polyurethane solution A1. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend C 1.

Blending Examples 2 to 5

Materials were blended according to the respective formulations shown in Table 2 in the same manner as in Blending Example 1. The blends prepared in Blending Examples 2 to 5 were defined as main agent blends C2 to C5, respectively. It is noted here that the numerical values in the table indicate values in "parts by mass."

Blending Example 6

Using a three-roll mill (manufactured by Inoue MFG., Inc., type: S-4 3/4×11), 160.0 parts by mass of the polyurethane solution A1, 6.3 parts by mass of silica powder (manufactured by Nippon Aerosil Co., Ltd., trade name: AEROSIL R-974), 1.0 part by mass of hydrotalcite (manufactured by Kyowa Chemical Industry Co., Ltd., trade name: DHT-4A), 0.72 parts by mass of melamine (manufactured by Nissan Chemical Industries, Ltd.) as a curing accelerator, and 8.4 parts by mass of diethylene glycol diethyl ether were mixed to incorporate the silica powder and the curing accelerator into the polyurethane solution A1. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend C6.

Blending Example 7

Materials were blended according to the formulation shown in Table 2 in the same manner as in Blending Example 1. The blend prepared in Blending Example 7 was defined as a main agent blend. C7. It is noted here that the numerical values in the table indicate values in "parts by mass."

Blending Examples 8 and 9

Materials were blended according to the respective formulations shown in Table 2 in the same manner as in Blending Example 1. The blends prepared in Blending Examples 8 and 9 were defined as main agent blends C8 and C9, respectively. It is noted here that the numerical values in the table indicate values in "parts by mass."

Comparative Blending Example 1

Using a three-roll mill (manufactured by Inoue MFG., Inc., type: S-4 3/4×11), 140.0 parts by mass of the polyurethane solution B1, 5.5 parts by mass of silica powder (manufactured by Nippon Aerosil Co., Ltd. trade name: AEROSIL R-974), 0.72 parts by mass of melamine (manufactured by Nissan Chemical Industries, Ltd.) as a curing accelerator, and 8.4 parts by mass of ethylene glycol diethyl ether were mixed to incorporate the silica powder and the curing accelerator into the polyurethane solution B1. Subsequently, 2.0 parts by mass of an antifoaming agent (manufactured by Momentive Performance Materials Inc., trade name: TSA750S) was added, and the resultant was mixed using a spatula. The thus obtained blend was defined as a main agent blend D1.

Comparative Blending Example 2

Materials were blended according to the formulation shown in Table 2 in the same manner as in Blending Example I. The blend prepared in Comparative Blending Example 2 was defined as a main agent blend D2. It is noted here that the numerical values in the table indicate values in "parts by mass."

TABLE 2

| | Formulations of Main Agent Blends | | | | | |
|---|---|---|---|---|---|---|
| | Blending Example 1 (main agent blend C1) | Blending Example 2 (main agent blend C2) | Blending Example 3 (main agent blend C3) | Blending Example 4 (main agent blend C4) | Blending Example 5 (main agent blend C5) | Blending Example 6 (main agent blend C6) |
| Polyurethane solution A1 (solid concentration: 40.0%) | 160.0 | | | | | 160.0 |
| Polyurethane solution A2 (solid concentration: 40.0%) | | 160.0 | | | | |
| Polyurethane solution A3 (solid concentration: 40.0%) | | | 160.0 | | | |

TABLE 2-continued

Formulations of Main Agent Blends

| | Blending Example 1 (main agent blend C1) | Blending Example 2 (main agent blend C2) | Blending Example 3 (main agent blend C3) | Blending Example 4 (main agent blend C4) | Blending Example 5 (main agent blend C5) | Blending Example 6 (main agent blend C6) |
|---|---|---|---|---|---|---|
| Polyurethane solution A4 (solid concentration: 40.0%) | | | 160.0 | | | |
| Polyurethane solution A5 (solid concentration: 40.0%) | | | | 160.0 | | |
| Polyurethane solution A6 (solid concentration: 40.0%) | | | | | | |
| Polyurethane solution A7 (solid concentration: 40.0%) | | | | | | |
| Polyurethane solution B1 (solid concentration: 45.0%) | | | | | | |
| Polyurethane solution B2 (solid concentration: 40.0%) | | | | | | |
| Silica powder AEROSIL R-974 | 6.3 | 9.45 | 9.45 | 6.3 | 9.45 | 6.3 |
| Hydrotalcite DHT-4A | | | | | | 1.0 |
| Diethylene glycol diethyl ether | 8.4 | 8.4 | 8.4 | 8.4 | 8.4 | 8.4 |
| Curing accelerator melamine | 0.72 | 0.72 | 0.72 | 0.72 | 0.72 | 0.72 |
| Antifoaming agent TSA750S | 2.0 | 2.0 | 2.0 | 2.0 | 2.0 | 2.0 |

| | Blending Example 7 (main agent blend C7) | Blending Example 8 (main agent blend C8) | Blending Example 9 (main agent blend C9) | Comparative Blending Example 1 (main agent blend D1) | Comparative Blending Example 2 (main agent blend D2) |
|---|---|---|---|---|---|
| Polyurethane solution A1 (solid concentration: 40.0%) | | | | | |
| Polyurethane solution A2 (solid concentration: 40.0%) | | | | | |
| Polyurethane solution A3 (solid concentration: 40.0%) | 160.0 | | | | |
| Polyurethane solution A4 (solid concentration: 40.0%) | | | | | |
| Polyurethane solution A5 (solid concentration: 40.0%) | | | | | |
| Polyurethane solution A6 (solid concentration: 40.0%) | | 160.0 | | | |
| Polyurethane solution A7 (solid concentration: 40.0%) | | | 160.0 | | |
| Polyurethane solution B1 (solid concentration: 45.0%) | | | | 140.0 | |
| Polyurethane solution B2 (solid concentration: 40.0%) | | | | | 160.0 |
| Silica powder AEROSIL R-974 | 6.3 | 6.3 | 9.45 | 5.5 | 6.3 |
| Hydrotalcite DHT-4A | 1.0 | | | | |
| Diethylene glycol diethyl ether | 8.4 | 8.4 | 8.4 | 8.4 | 8.4 |
| Curing accelerator melamine | 0.72 | 0.72 | 0.72 | 0.72 | 0.72 |
| Antifoaming agent TSA750S | 2.0 | 2.0 | 2.0 | 2.0 | 2.0 |

<Production of Curing Agent Solutions>

Curing Agent Solution Blending Example 1)

To a vessel equipped with a stirrer, a thermometer and a condenser, 16.85 parts by mass an epoxy resin having a structure represented by following formula (6) (manufactured by Mitsubishi Chemical Corporation, grade name: JER604, epoxy equivalent: 120 g/eqv) and 18.25 parts by mass of diethylene glycol diethyl ether were added, and stirring thereof was initiated.

While continuously stirring the materials, the inner temperature of the vessel was raised to 40° C. using an oil bath. After the inner temperature reached 40° C., stirring was continued for another 30 minutes. Thereafter, JER604 was confirmed to have been completely dissolved, and the resulting solution was cooled to room temperature, whereby a JER604-containing solution having a concentration of 48% by mass was obtained. This solution was defined as a curing agent solution E1.

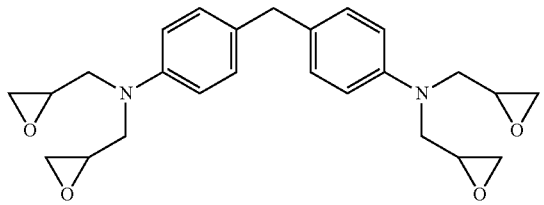

(6)

(Curing Agent Solution Blending Example 2)

To a vessel equipped with a stirrer, a thermometer and a condenser, 16.85 parts by mass of an epoxy resin containing N,N-diglycidyl-4-(glycidyloxy)aniline as a main component (manufactured by Mitsubishi Chemical Corporation, grade name: JER630, epoxy equivalent: 98 g/eqv) and 18.25 parts by mass of diethylene glycol diethyl ether were added, and stirring thereof was initiated.

While continuously stirring the materials, the inner temperature of the vessel was raised to 40° C. using an oil bath.

After the inner temperature reached 40° C., stirring was continued for another 30 minutes. Thereafter, JER630 was confirmed to have been completely dissolved, and the resulting solution was cooled to room temperature, whereby a JER630-containing solution having a concentration of 48% by mass was obtained. This solution was defined as a curing agent solution E2.

<Mixing of Main Agent Blend with Curing Agent-Containing Solution>

(Curable Composition Blending Example 1)

To a plastic container, 88.71 parts by mass of the main agent blend C1 and 3.51 parts by mass of the curing agent solution E1 were added. Further, in order to match the viscosity of the resultant with that of the respective curable compositions of the below-described other Blending Examples and Comparative Blending Examples. 3.0 parts by mass of diethylene glycol diethyl ether and 1.5 parts by mass of diethylene glycol ethyl ether acetate were added as solvents. These materials were mixed at room temperature for 5 minutes by stirring with a spatula, whereby a curable composition (hereinafter referred to as "curable composition F1") was obtained. The thus obtained curable composition F1 had a viscosity of 37,000 mPa·s at 25° C. and a thixotropy index of 1.15.

(Curable Composition Blending Examples 2 to 9)

Materials were blended according to the respective formulations shown in Table 3 in the same manner as in Curable Composition Blending Example 1. The blends prepared in Curable Composition Blending Examples 2 to 9 were defined as curable compositions F2 to F9, respectively.

(Curable Composition Blending Example 10)

To a plastic container, 88.71 parts by mass of the main agent blend C8 and 1.215 parts by mass of the curing agent solution E2 were added. Further, in order to match the viscosity of the resultant with that of the respective curable compositions of the below-described other Blending Examples and Comparative Blending Examples, 2.51 parts by mass of diethylene glycol diethyl ether and 1.5 parts by mass of diethylene glycol ethyl ether acetate were added as solvents. These materials were mixed at room temperature for 5 minutes by stirring with a spatula, whereby a curable composition (hereinafter referred to as "curable composition F10") was obtained. The thus obtained curable composition F10 had a viscosity of 37,000 mPa·s at 25° C. and a thixotropy index of 1.17.

(Curable Composition Blending Example 11)

To a plastic container, 90.285 parts by mass of the main agent blend C9 and 3.51 parts by mass of the curing agent solution E1 were added. Further, in order to match the viscosity of the resultant with that of the respective curable compositions of the below-described other Blending Examples and Comparative Blending Examples, 5.5 parts by mass of diethylene glycol diethyl ether and 1.5 parts by mass of diethylene glycol ethyl ether acetate were added as solvents. These materials were mixed at room temperature for 5 minutes by stirring with a spatula, whereby a curable composition (hereinafter referred to as "curable composition F11") was obtained. The thus obtained curable composition F11 had a viscosity of 34,000 mPa·s at 25° C. and a thixotropy index of 1.23.

(Comparative Curable Composition Blending Example 1)

To a plastic container, 78.62 g of the main agent blend D1 and 5.62 g of the curing agent solution E1 were added. Further, in order to match the viscosity of the resultant with that of the respective curable compositions of the below-described other Blending Examples and Comparative Blending Examples, 4.8 g of diethylene glycol diethyl ether and 1.3 g of diethylene glycol ethyl ether acetate were added as solvents. These materials were mixed at room temperature for 5 minutes by stirring with a spatula, whereby a curable composition (hereinafter referred to as "curable composition G1") was obtained. The thus obtained curable composition G1 had a viscosity of 38,000 mPa·s at 25° C. and a thixotropy index of 1.25.

(Comparative Curable Composition Blending Example 2)

In accordance with the formulation shown in Table 3, a curable composition (hereinafter referred to as "curable composition G2") was prepared in the same manner as in the above-described "Comparative Curable Composition Blending Example 1." The thus obtained curable composition G2 had a viscosity of 38,000 mPa·s at 25° C. and a thixotropy index of 1.25.

Table 2 shows the formulations of the curable compositions F1 to F9, G1 and G2. Further, Table 4 summarizes the amounts (parts by mass) of the respective components of the curable compositions F1 to F11, G1 and G2.

TABLE 3

Blending Formulations of Curable Compositions

| | Unit | Curable composition F1 | Curable composition F2 | Curable composition F3 | Curable composition F4 | Curable composition F5 | Curable composition F6 | Curable composition F7 |
|---|---|---|---|---|---|---|---|---|
| Main agent blend C1 | parts by mass | 88.71 | | | | | | |
| Main agent blend C2 | parts by mass | | 90.285 | | | | | |
| Main agent blend C3 | parts by mass | | | 90.285 | | | | |
| Main agent blend C4 | parts by mass | | | | 88.71 | | | |
| Main agent blend C5 | parts by mass | | | | | 90.285 | | |
| Main agent blend C6 | parts by mass | | | | | | 89.21 | |
| Main agent blend C7 | parts by mass | | | | | | | 89.21 |
| Main agent blend C8 | parts by mass | | | | | | | |
| Main agent blend C9 | parts by mass | | | | | | | |
| Polyurethane solution A1 (solid concentration: 40.0%) | parts by mass | | | | | | | |
| Polyurethane solution A4 (solid concentration: 40.0%) | parts by mass | | | | | | | |
| Main agent blend D1 | parts by mass | | | | | | | |
| Main agent blend D2 | parts by mass | | | | | | | |
| Curing agent solution E1 | parts by mass | 3.51 | 3.51 | 3.51 | 3.51 | 4.27 | 3.51 | 3.51 |
| Curing agent solution E2 | parts by mass | | | | | | | |

TABLE 3-continued

Blending Formulations of Curable Compositions

| | | | | | | | | |
|---|---|---|---|---|---|---|---|---|
| Diethylene glycol diethyl ether | parts by mass | 3.0 | 5.5 | 5.5 | 3.0 | 5.5 | 3.0 | 3.0 |
| Diethylene glycol ethyl ether acetate | parts by mass | 1.5 | 1.5 | 1.5 | 1.5 | 1.5 | 1.5 | 1.5 |
| 1,5-diazabicyclo(4.3.0)nonene-5 | parts by mass | | | | | | | |
| Antifoaming agent TSA750S | parts by mass | | | | | | | |
| Viscosity | mPa · s (25° C.) | 37,000 | 35,000 | 35,000 | 37,000 | 36,000 | 39,000 | 39,000 |
| Thixotropy index | | 1.15 | 1.23 | 1.23 | 1.15 | 1.23 | 1.16 | 1.16 |
| Number of epoxy groups/number of carboxyl groups | | 1.0 | 1.0 | 1.0 | 1.0 | 1.0 | 1.0 | 1.0 |

| | | Unit | Curable composition F8 | Curable composition F9 | Curable composition F10 | Curable composition F11 | Curable composition G1 | Curable composition G2 |
|---|---|---|---|---|---|---|---|---|
| | Main agent blend C1 | parts by mass | | | | | | |
| | Main agent blend C2 | parts by mass | | | | | | |
| | Main agent blend C3 | parts by mass | | | | | | |
| | Main agent blend C4 | parts by mass | | | | | | |
| | Main agent blend C5 | parts by mass | | | | | | |
| | Main agent blend C6 | parts by mass | | | | | | |
| | Main agent blend C7 | parts by mass | | | | | | |
| | Main agent blend C8 | parts by mass | | | 88.71 | | | |
| | Main agent blend C9 | parts by mass | | | | 90.285 | | |
| | Polyurethane solution A1 (solid concentration: 40.0%) | parts by mass | 100.0 | | | | | |
| | Polyurethane solution A4 (solid concentration: 40.0%) | parts by mass | | 100.0 | | | | |
| | Main agent blend D1 | parts by mass | | | | | 78.62 | |
| | Main agent blend D2 | parts by mass | | | | | | 88.71 |
| | Curing agent solution E1 | parts by mass | 4.45 | 4.45 | | 3.51 | 5.62 | 3.51 |
| | Curing agent solution E2 | parts by mass | | | 1.215 | | | |
| | Diethylene glycol diethyl ether | parts by 2.51 | 2.51 | 2.51 | 5.5 | 4.8 | 3.0 | mass |
| | Diethylene glycol ethyl ether acetate | parts by mass | | | 1.5 | 1.5 | 1.3 | 1.5 |
| | 1,5-diazabicyclo(4.3.0)nonene-5 | parts by mass | 0.25 | 0.25 | | | | |
| | Antifoaming agent TSA750S | parts by mass | 1.0 | 1.0 | | | | |
| | Viscosity | mPa · s (25° C.) | 32,000 | 31,000 | 37,000 | 34,000 | 38,000 | 38,000 |
| | Thixotropy index | | 1.02 | 1.02 | 1.17 | 1.23 | 1.25 | 1.25 |
| | Number of epoxy groups/number of carboxyl groups | | 1.0 | 1.0 | 10 | 1.0 | 1.0 | 1.0 |

TABLE 4

| | | Unit | Example 1 | Example 2 | Example 3 | Example 4 | Example 5 | Example 6 | Example 7 |
|---|---|---|---|---|---|---|---|---|---|
| | Curable composition used | | Curable composition F1 | Curable composition F2 | Curable composition F3 | Curable composition F4 | Curable composition F5 | Curable composition F6 | Curable composition F7 |
| Component (a) (Polyurethane according to the present invention) | Polyurethane AU1 | parts by mass | 32.1 | | | | | 32.1 | |
| | Polyurethane AU2 | | | 32.1 | | | | | |
| | Polyurethane AU3 | | | | 32.1 | | | | 32.1 |
| | Polyurethane AU4 | | | | | 32.1 | | | |
| | Polyurethane AU5 | | | | | | 32.1 | | |
| | Polyurethane AU6 | | | | | | | | |
| | Polyurethane AU7 | | | | | | | | |
| Polyurethane other than component (a) | Polyurethane BU1 | | | | | | | | |
| | Polyurethane BU2 | | | | | | | | |
| Component (b) | γ-butyrolactone | parts by mass | 40.7 | 40.7 | 40.7 | 40.7 | 40.7 | 40.7 | 40.7 |
| | Diethylene glycol diethyl ether | | 16.2 | 18.7 | 18.7 | 16.2 | 19.1 | 16.2 | 16.2 |
| | Diethylene glycol ethyl ether acetate | | 1.50 | 1.50 | 1.50 | 1.50 | 1.50 | 1.50 | 1.50 |
| | Total amount of component (b) | | 58.4 | 60.9 | 60.9 | 58.4 | 61.3 | 58.4 | 58.4 |
| Component (c) | jER604 | parts by mass | 1.69 | 1.69 | 1.69 | 1.69 | 2.05 | 1.69 | 1.69 |

TABLE 4-continued

| | | | | | | | | | |
|---|---|---|---|---|---|---|---|---|---|
| | jER630 | parts by mass | | | | | | | |
| Component (d) | AEROSIL R-974 | parts by mass | 3.15 | 4.73 | 4.73 | 3.15 | 4.73 | 3.15 | 3.15 |
| | Hydrotalcite DHT-4A | | | | | | | 0.50 | 0.50 |
| Curing accelerator | Melamine | parts by mass | 0.36 | 0.36 | 0.36 | 0.36 | 0.36 | 0.36 | 0.36 |
| | 1,5-diazabicyclo(4.3.0)nonene-5 | | | | | | | | |
| Antifoaming agent | TSA750S | parts by mass | 1.0 | 1.0 | 1.0 | 1.0 | 1.0 | 1.0 | 1.0 |
| Viscosity | | mPa·s (25° C.) | 37,000 | 35,000 | 35,000 | 37,000 | 36,000 | 39,000 | 39,000 |
| Thixotropy index | | | 1.15 | 1.23 | 1.23 | 1.15 | 1.23 | 1.16 | 1.16 |
| Carboxyl group/epoxy group | | | 1.0 | 1.0 | 1.0 | 1.0 | 1.0 | 1.0 | 1.0 |

| | | Unit | Example 8 | Example 9 | Example 10 | Example 11 | Comparative Example 1 | Comparative Example 2 |
|---|---|---|---|---|---|---|---|---|
| Curable composition used | | | Curable composition F8 | Curable composition F9 | Curable composition F10 | Curable composition F11 | Curable composition G1 | Curable composition G2 |
| Component (a) (Polyurethane according to the present invention) | Polyurethane AU1 | parts by mass | 40.1 | | | | | |
| | Polyurethane AU2 | | | | | | | |
| | Polyurethane AU3 | | | | | | | |
| | Polyurethane AU4 | | | 40.1 | | | | |
| | Polyurethane AU5 | | | | | | | |
| | Polyurethane AU6 | | | | 32.2 | | | |
| | Polyurethane AU7 | | | | | 32.1 | | |
| Polyurethane other than component (a) | Polyurethane BU1 | | | | | | 31.6 | |
| | Polyurethane BU2 | | | | | | | 32.1 |
| Component (b) | γ-butyrolactone | parts by mass | 50.9 | 50.9 | 40.6 | 40.7 | 32.9 | 40.7 |
| | Diethylene glycol diethyl ether | | 13.1 | 13.1 | 14.5 | 18.7 | 17.7 | 16.2 |
| | Diethylene glycol ethyl ether acetate | | 0 | 0 | 1.50 | 1.50 | 1.30 | 1.50 |
| | Total amount of component (b) | | 64.0 | 64.0 | 56.6 | 60.9 | 51.9 | 58.4 |
| Component (c) | jER604 | parts by mass | 2.14 | 2.14 | | 1.69 | 2.70 | 1.69 |
| | jER630 | parts by mass | | | 0.58 | | | |
| Component (d) | AEROSIL R-974 | parts by mass | 2.31 | 2.31 | 3.15 | 4.73 | 2.76 | 3.15 |
| | Hydrotalcite DHT-4A | | | | | | | |
| Curing accelerator | Melamine | parts by mass | | | | 0.36 | 0.36 | 0.36 |
| | 1,5-diazabicyclo(4.3.0)nonene-5 | | | 0.25 | 0.25 | | | |
| Antifoaming agent | TSA750S | parts by mass | 1.0 | 1.0 | 1.0 | 1.0 | 1.0 | 1.0 |
| Viscosity | | mPa·s (25° C.) | 32,000 | 31,000 | 37,000 | 34,000 | 38,000 | 38,000 |
| Thixotropy index | | | 1.02 | 1.02 | 1.17 | 1.23 | 1.25 | 1.25 |
| Carboxyl group/epoxy group | | | 1.0 | 1.0 | 1.0 | 1.0 | 1.0 | 1.0 |

Examples 1 to 9, and Comparative Examples 1 and 2

Using the curable compositions F1 to F11, G1 and G2, the flexibility, the wiring breakage inhibition, the warpage and the long-term electrical insulation reliability were evaluated by the below-described respective methods. The results thereof are shown in Table 5.

<Evaluation of Flexibility>

On the toper of a flexible copper-clad laminate (manufactured by Sumitomo Metal Mining Co., Ltd., grade name: SPERFLEX, copper thickness: 8 μm, polyimide thickness: 38 μm), the curable composition F1 was screen-printed at a width of 75 mm and a length of 110 mm such that the resulting film had a post-curing thickness of 15 μm, and this laminate was maintained at room temperature for 10 minutes and subsequently placed in a 120° C. hot air circulation-type dryer for 60 minutes to cure the curable composition F1. An undercoat PET film of the thus prepared test piece was peeled off, and the test piece was cut into the form of a 10-mm wide strip using a utility knife, after which this strip was bent about 180 degrees such that the cured film surface faced outside, and the resultant was compressed at 0.5±0,2 MPa for 3 seconds using a compressor. The bent portion in a bent state was observed under a microscope at a magnification of 30, and the presence or absence of cracks was examined. The results thereof are shown in Table 5.

Further, the same evaluation was performed using the curable compositions F2 to F11, G1 and G2. The results thereof are also shown in Table 5.

<Evaluation of Inhibition of Wiring Breakage of Wiring Board (MIT Test)>

On a flexible wiring board prepared by tin-plating a substrate that was produced by etching a flexible copper-clad laminate (manufactured by Sumitomo Metal Mining Co., Ltd., grade name: S'PERFLEX US, copper thickness: 8 μm, polyimide thickness: 38 μm) and had a fine comb-like pattern shape described in JPCA-ET01 (copper line width/copper line width=15 μm/15 μm), the curable composition F1 was screen-printed such that the resulting printed film had a thickness (after drying) of 10 μm from the polyimide surface. The thus obtained wiring board having a printed film formed thereon was placed in an 80° C. hot air circulation-type dryer for 30 minutes and then in a 120° C. hot air circulation-type dryer for 120 minutes, whereby the printed film was cured.

The thus obtained test piece was ed in accordance with JIS C-5016 under the following test conditions.

(Test Conditions)
Tester: MIT Tester BE202, manufactured by Tester Sangyo Co., Ltd.
Folding rate: 10 times/min
Load: 200 g
Folding angle: ±90°
Radius of chuck tip: 0.5 mm The number of folding operations was gradually increased by 10 times at a time under the above-described test conditions, and the presence or absence of a wiring crack was visually observed, recording the number of folding operations when a crack was generated. The results thereof are shown in Table 5.

Further, the same evaluation was performed using the curable compositions F2 to F11, G1 and G2. The results thereof are also shown in Table 5.

<Evaluation of Warpage>

The curable composition F 1 was screen-printed on a substrate using a #180-mesh polyester screen, and this substrate was placed in an 80° C. hot air circulation-type dryer for 30 minutes. Then, the substrate was placed in a 120° C. hot air circulation-type dryer for 60 minutes to cure the printed curable composition F1. As the substrate, a 25 μm-thick polyimide film [KAPTON (registered trademark) 1.00EN, manufactured by DuPont-Toray Co., Ltd.] was used.

The cured film thus obtained by printing the curable composition and then curing the composition in the hot air circulation-type dryer was cut to a size of 50 mmϕ using a circle cutter. The vicinity of the center of the cured film thus cut into a circular shape displayed warping deformation in a convex or concave shape. After one hour, the substrate having the cured film formed thereon that was cut by the circle cutter was set still with the convex side facing down, i.e., in such a manner that the vicinity of the center of the cured film formed on the substrate was brought into contact with a horizontal surface. Then, the maximum and minimum values of the warpage height from the horizontal surface were measured, and the average value thereof was calculated. Plus/minus signs each represent the direction of warpage and, when a sample was set still with the convex side facing down, a case where the cured film was positioned on the upper side of the copper substrate or the polyimide film was assigned with "+", whereas a case where the cured film was positioned on the lower side was assigned with "−". A warpage of less than +3.0 mm was regarded as satisfactory.

The results thereof are shown in Table 5.

Further, the same evaluation was performed using the curable compositions F2 to F11, G1 and G2. The results thereof are also shown in Table 5.

<Evaluation of Long-Term Electrical Insulation Reliability>

On a flexible wiring board prepared by tin-plating a substrate that was produced by etching a flexible copper-clad laminate (manufactured by Swnitomo Metal Mining Co., Ltd., grade name: S'PERFLEX US, copper thickness: 8 μm, polyimide thickness: 38 μm) and had a fine comb-like pattern shape described in JPCA-ET01 (copper line width/copper line width=15 μm/15 μm), the curable composition F1 was screen-printed such that the resulting film had a thickness (after drying) of 15 μm from the polyimide surface. This flexible wiring board was placed in an 80° C. hot air circulation-type dryer for 30 minutes and then in a 120° C. hot air circulation-type dryer for 120 minutes, whereby the printed curable composition F1 was cured.

A bias voltage of 60 V was applied to the thus obtained test piece, and a constant temperature and humidity test was performed on the test piece at a temperature of 120° C. and a humidity of 85% RH using MIGRATION TESTER MODEL MIG-8600 (manufactured by IMV Corporation). The results of measuring the resistance value of the substrate having the fine comb-like pattern shape at the start of the constant temperature and humidity test as well as at 100 hours, 250 hours and 400 hours after the start of the test are shown in Table 5.

Further, the same evaluation was performed using the curable compositions F2 to F11, G1 and G2. The results thereof are also shown in Table 5.

TABLE 5

| | Unit | Example 1 | Example 2 | Example 3 | Example 4 | Example 5 | Example 6 | Example 7 |
|---|---|---|---|---|---|---|---|---|
| Curable composition used | | Curable composition F1 | Curable composition F2 | Curable composition F3 | Curable composition F4 | Curable composition F5 | Curable composition F6 | Curable composition F7 |
| Thickness of cured product | μm | 5 | 5 | 5 | 5 | 5 | 5 | 5 |
| Evaluation of flexibility | | no crack generation | no crack generation | no crack generation | no crack generation | no crack generation | no crack generation | no crack generation |
| Evaluation of inhibition of wiring breakage of wiring board (MIT Test) | times | 220 | 220 | 220 | 190 | 230 | 210 | 210 |
| Evaluation of warpage | | satisfactory (+2.0 mm) | satisfactory (+2.0 mm) | satisfactory (+2.2 mm) | satisfactory (+2.8 mm) | satisfactory (+2.5 mm) | satisfactory (+2.2 mm) | satisfactory (+2.4 mm) |

TABLE 5-continued

| | | | | | | | | |
|---|---|---|---|---|---|---|---|---|
| Evaluation of long-term insulation reliability | at the start | Ω | 6 × 10⁸ | 3 × 10⁸ | 6 × 10⁸ | 3 × 10⁸ | 3 × 10⁸ | 6 × 10⁸ | 6 × 10⁸ |
| | 100 hours after the start | | 4 × 10⁸ | 6 × 10⁸ | 5 × 10⁸ | 6 × 10⁸ | 6 × 10⁸ | 4 × 10⁸ | 5 × 10⁸ |
| | 250 hours after the start | | 2 × 10⁸ | 6 × 10⁸ | 4 × 10⁸ | 6 × 10⁸ | 6 × 10⁸ | 3 × 10⁸ | 4 × 10⁸ |
| | 400 hours after the start | | 1 × 10⁸ | 5 × 10⁸ | 2 × 10⁸ | 5 × 10⁸ | 5 × 10⁸ | 2 × 10⁸ | 3 × 10⁸ |

| | | Unit | Example 8 | Example 9 | Example 10 | Example 11 | Comparative Example 1 | Comparative Example 2 |
|---|---|---|---|---|---|---|---|---|
| Curable composition used | | | Curable composition F8 | Curable composition F9 | Curable composition F10 | Curable composition F11 | Curable composition G1 | Curable composition G2 |
| Thickness of cured product | | μm | 4 | 4 | 5 | 5 | 8 | 8 |
| Evaluation of flexibility | | | no crack generation | no crack generation | no crack generation | no crack generation | no crack generation | no crack generation |
| Evaluation of inhibition of wiring breakage of wiring board (MIT Test) | | times | 180 | 170 | 220 | 160 | 110 | 250 |
| Evaluation of warpage | | | satisfactory (+1.3 mm) | satisfactory (+2.7 mm) | satisfactory (+2.8 mm) | satisfactory (+1.3 mm) | satisfactory (+1.2 mm) | not satisfactory (+7.5 mm) |
| Evaluation of long-term insulation reliability | at the start | Ω | 3 × 10⁸ | 3 × 10⁸ | 3 × 10⁸ | 2 × 10⁸ | 4 × 10⁸ | 4 × 10⁸ |
| | 100 hours after the start | | 3 × 10⁸ | 6 × 10⁸ | 6 × 10⁸ | 4 × 10⁸ | 3 × 10⁸ | 3 × 10⁸ |
| | 250 hours after the start | | 2 × 10⁸ | 6 × 10⁸ | 6 × 10⁸ | 4 × 10⁸ | 2 × 10⁸ | 2 × 10⁸ |
| | 400 hours after the start | | 1 × 10⁸ | 5 × 10⁸ | 5 × 10⁸ | 3 × 10⁸ | 1 × 10⁸ | 1 × 10⁸ |

According to the results of Table 5, the curable composition of the present invention (I) exhibits excellent flexibility, wiring breakage inhibition, low warpage and long-term electrical insulation reliability, and a cured product thereof is thus useful as an insulating protective film for flexible wiring boards.

INDUSTRIAL APPLICABILITY

The curable composition of the present invention can be suitably utilized for the formation of an overcoat film for a flexible wiring board.

The invention claimed is:

1. A curable composition comprising
   (component (a)) a carboxyl group-containing polyurethane which has an aromatic ring concentration of 0.1 to 6.5 mmol/g, contains an organic residue derived from a polyisocyanate, and further has a structural unit represented by formula (1):

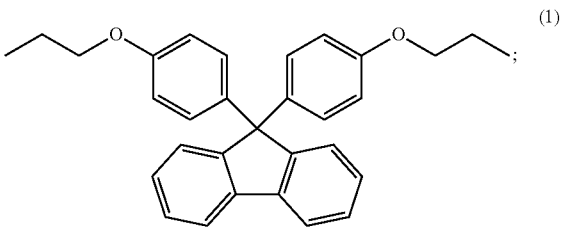

(component (b)) a solvent; and
(component (c)) a compound having two or more epoxy groups in one molecule.

2. The curable composition according to claim 1, wherein component (a) is a polyurethane further having a structural unit represented by formula (2):

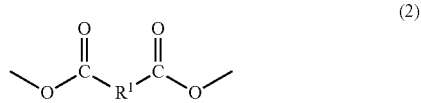

wherein $R^1$ each independently represents a phenylene group or a phenylene group having a substituent.

3. The curable composition according to claim 1, wherein component (a) is a polyurethane further having a structural unit represented by formula (3):

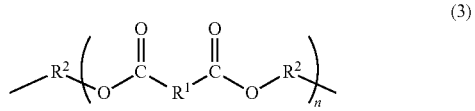

(3)

wherein $R^1$s each independently represent a phenylene group or a phenylene group having a substituent; (n+1) $R^2$s each independently represent an alkylene group having 3 to 9 carbon atoms; and n represents a natural number of not more than 50.

4. The curable composition according to claim 1, wherein component (a) contains an organic residue derived from a cyclic aliphatic polyisocyanate in an amount of not less than 70% by mole based on the total amount of the organic residue derived from the polyisocyanate.

5. The curable composition according to claim 1, wherein the amount of component (a) is 40 to 99% by mass based on the total amount of components (a) and (c).

6. The curable composition according to claim 1, wherein the amount of component (b) is 25 to 75% by mass based on the total amount of components (a), (b) and (c).

7. The curable composition according to claim 1, wherein component (a) has a number-average molecular weight of 3,000 to 50,000 and an acid value of 10 to 70 mg-KOH/g.

8. The curable composition according to claim 1, further comprising
(component (d)) at least one particulate selected from the group consisting of an inorganic particulate and organic particulate.

9. The curable composition according to claim 8, wherein component (d) comprises a silica particulate.

10. The curable composition according to claim 8, wherein component (d) comprises a hydrotalcite particulate.

11. A cured product of the curable composition according to claim 1.

12. A flexible wiring board overcoat film comprising the cured product according to claim 11.

13. A flexible wiring board comprising a flexible substrate and a wiring formed on the flexible substrate, wherein a part or all of a surface on which the wiring is formed is covered with the overcoat film according to claim 12.

14. A method of producing a flexible wiring board covered with an overcoat film, comprising
(step A) the step of printing the curable composition according to claim 1 on a part or all of a surface of a flexible wiring board comprising a flexible substrate and a wiring formed on the flexible substrate, on which surface the wiring is formed, and thereby forming a printed film on the wiring;
(step B) the step of placing the printed film obtained in step A in an atmosphere of 40° C. to 100° C. to evaporate a part or all of the solvent contained in the printed film; and
(step C) the step of heating and curing the printed film obtained in step A or the printed film obtained in step B at 100° C. to 170° C. to form an overcoat film.

* * * * *